United States Patent
Burak et al.

(10) Patent No.: US 9,748,918 B2
(45) Date of Patent: *Aug. 29, 2017

(54) ACOUSTIC RESONATOR COMPRISING INTEGRATED STRUCTURES FOR IMPROVED PERFORMANCE

(71) Applicant: Avago Technologies General IP (Singapore) Pte. Ltd., Singapore (SG)

(72) Inventors: Dariusz Burak, Fort Collins, CO (US); John Choy, Westminster, CO (US); Phil Nikkel, Loveland, CO (US); Kevin J. Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 161 days.

This patent is subject to a terminal disclaimer.

(21) Appl. No.: 14/092,793

(22) Filed: Nov. 27, 2013

(65) Prior Publication Data

US 2014/0225683 A1  Aug. 14, 2014

Related U.S. Application Data

(63) Continuation-in-part of application No. 13/955,774, filed on Jul. 31, 2013, now Pat. No. 9,246,473, and a
(Continued)

(51) Int. Cl.
*H03H 9/15* (2006.01)
*H03H 9/02* (2006.01)
(Continued)

(52) U.S. Cl.
CPC .... *H03H 9/02102* (2013.01); *H03H 9/02118* (2013.01); *H03H 9/132* (2013.01); *H03H 9/173* (2013.01)

(58) Field of Classification Search
CPC ............. H03H 9/02102; H03H 9/0211; H03H 9/02118; H03H 9/132; H03H 9/173
(Continued)

(56) References Cited

U.S. PATENT DOCUMENTS 4,456,850 A   6/1984 Inoue et al.
5,587,620 A   12/1996 Ruby et al.
(Continued)

FOREIGN PATENT DOCUMENTS

JP   60-16010    1/1985
JP   4471443    6/2010
WO   WO-2007085332   8/2007

OTHER PUBLICATIONS

K.M. Lakin et al.; "Temperature Compensated Bulk Acoustic Thin Film Resonators"; 2000 IEEE Ultrasonics Symposium, vol. 1, pp. 855-858, Oct. 22-25, 2000, with 1 page IEEE Xplore Abstract.*
(Continued)

*Primary Examiner* — Barbara Summons

(57) ABSTRACT

An acoustic resonator structure comprises a first electrode disposed on a substrate, a piezoelectric layer disposed on the first electrode, a second electrode disposed on the piezoelectric layer, and an air cavity disposed in the substrate below at least a portion of a main membrane region defined by an overlap between the first electrode. The acoustic resonator structure may further comprise various integrated structures at or around the main membrane region to improve its electrical performance.

19 Claims, 26 Drawing Sheets

Related U.S. Application Data continuation-in-part of application No. 13/766,993, filed on Feb. 14, 2013, now Pat. No. 9,444,426.

(51) Int. Cl.
 *H03H 9/17* (2006.01)
 *H03H 9/13* (2006.01)

(58) Field of Classification Search
 USPC .......................... 333/187, 189; 310/346–349
 See application file for complete search history.

(56) References Cited

U.S. PATENT DOCUMENTS

| | | | |
|---|---|---|---|
| 5,873,153 | A | 2/1999 | Ruby et al. |
| 6,107,721 | A | 8/2000 | Lakin |
| 6,396,200 | B2 | 5/2002 | Misu et al. |
| 6,420,820 | B1 | 7/2002 | Larson, III |
| 6,507,983 | B1 | 1/2003 | Ruby et al. |
| 6,709,776 | B2 | 3/2004 | Noguchi et al. |
| 6,936,837 | B2 | 8/2005 | Yamada et al. |
| 6,989,723 | B2 * | 1/2006 | Komuro ................ H03H 3/04 333/133 |
| 7,199,683 | B2 | 4/2007 | Thalhammer |
| 7,280,007 | B2 | 10/2007 | Feng et al. |
| 7,345,410 | B2 | 3/2008 | Grannen et al. |
| 7,358,831 | B2 | 4/2008 | Larson, III et al. |
| 7,369,013 | B2 | 5/2008 | Fazzio et al. |
| 7,388,454 | B2 | 6/2008 | Ruby et al. |
| 7,466,213 | B2 | 12/2008 | Loebl et al. |
| 7,575,292 | B2 | 8/2009 | Furukawa |
| 7,629,865 | B2 | 12/2009 | Ruby |
| 7,636,026 | B2 | 12/2009 | Heinze et al. |
| 7,758,979 | B2 | 7/2010 | Akiyama et al. |
| 7,889,024 | B2 | 2/2011 | Bradley et al. |
| 8,030,823 | B2 | 10/2011 | Sinha et al. |
| 8,222,795 | B2 | 7/2012 | Sinha et al. |
| 8,330,325 | B1 | 12/2012 | Burak et al. |
| 8,575,820 | B2 | 11/2013 | Shirakawa et al. |
| 9,490,418 | B2 * | 11/2016 | Burak ................ H03H 9/02118 |
| 2005/0110598 | A1 | 5/2005 | Larson, III et al. |
| 2007/0205850 | A1 | 9/2007 | Jamneala et al. |
| 2008/0179995 | A1 * | 7/2008 | Umeda ............... H03H 9/02086 310/324 |
| 2008/0258842 | A1 | 10/2008 | Ruby et al. |
| 2009/0001848 | A1 * | 1/2009 | Umeda ................... H03H 3/04 310/312 |
| 2010/0039000 | A1 | 2/2010 | Milson et al. |
| 2010/0327697 | A1 | 12/2010 | Choy et al. |
| 2010/0327994 | A1 | 12/2010 | Choy et al. |
| 2011/0084779 | A1 | 4/2011 | Zhang |
| 2011/0148547 | A1 | 6/2011 | Zhang |
| 2011/0180391 | A1 | 7/2011 | Larson et al. |
| 2011/0227671 | A1 | 9/2011 | Zhang |
| 2011/0266925 | A1 | 11/2011 | Ruby et al. |
| 2012/0218055 | A1 | 8/2012 | Burak et al. |
| 2012/0218056 | A1 | 8/2012 | Burak |
| 2012/0218057 | A1 | 8/2012 | Burak et al. |
| 2012/0280767 | A1 | 11/2012 | Burak et al. |
| 2013/0033151 | A1 | 2/2013 | Ueda et al. |
| 2013/0038408 | A1 | 2/2013 | Burak et al. |
| 2013/0106534 | A1 | 5/2013 | Burak et al. |
| 2013/0127300 | A1 * | 5/2013 | Umeda .................. H01L 41/18 310/365 |
| 2013/0241673 | A1 | 9/2013 | Yokoyama et al. |
| 2014/0152152 | A1 * | 6/2014 | Burak ................ H03H 9/02102 310/346 |
| 2014/0159548 | A1 * | 6/2014 | Burak ................ H03H 9/02118 310/346 |
| 2014/0232486 | A1 * | 8/2014 | Burak .................... H03H 9/175 333/187 |

OTHER PUBLICATIONS

Ranjan et al. "Strained Hexagonal ScN: A Material with Unusual Structural and Optical Properties," Physical Review Letters, Jun. 27, 2003, vol. 90, No. 25, The American Physical Society, USA, 4 pages.

Farrer et al., "Properties of hexagonal ScN versus wurtzite GaN and InN," Physical Review B, Nov. 20, 2002, vol. 66, No. 20, The American Physical Society, USA, 4 pages.

Constantin et al., "Composition-dependent structural properties in ScGaN alloy films: A combined experimental and theoretical study," Journal of Applied Physics, Dec. 16, 2005, vol. 98, No. 12, American Institute of Physics, USA, 8 pages.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010, 4 pages.

Zou, et al. "High Coupling Coefficient Temperature Compensated FBAR Resonator for Oscillator Application with Wide Pulling Range", 2010 IEEE International Frequency Control Symposium (FCS), Jun. 1-4, 2010, pp. 646-651 and one page IEEE Xplore Abstract.

Zhang, et al. "MIMO Multiplexer Based on Film Bulk Acoustic Resonator"; IEEE Transactions on Consumer Electronics, vol. 56, No. 2, May 2010, pp. 805-810.

"Co-pending U.S. Appl. No. 13/654,718, filed Oct. 18, 2012".
"Co-pending U.S. Appl. No. 13/658,024, filed Oct. 23, 2012".
"Co-pending U.S. Appl. No. 13/767,765, filed Feb. 14, 2013".
"Co-pending U.S. Appl. No. 14/092,077, filed Nov. 27, 2013".

Pineda, Humberto , "Thin-Film Bulk Acoustic Wave Resonators—FBAR", *Bellaterra, Monpelier* Dec. 2007 , 1-241.

Tang, et al., "Micromachined Bulk Acoustic Resonator With a Raised Frame", *16th International Conference on Mechatronics Technology*, Oct. 16-19, 2012, Tianjin, China Oct. 16-19, 2012, pp. 19-22.

Umeda, Keiichi et al., "Piezoelectric Properties of ScAlN Thin Films for Piezo-Mems Devices", *MEMS*, 2013, Taipei, Taiwan, Jan. 20-24, 2013 pp. 733-736 2013.

Co-pending U.S. Appl. No. 13/766,993, filed Feb. 14, 2013.
Co-pending U.S. Appl. No. 13/781,491, filed Feb. 28, 2013.
Co-pending U.S. Appl. No. 13/955,774, filed Jul. 31, 2013.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/662,425, filed Oct. 27, 2012.
Co-pending U.S. Appl. No. 13/662,460, filed Oct. 27, 2012.

Kerherve, "BAW Technologies for Radiofrequency Filters and Duplexers", Nov. 2011, 89 pages.

Lin, "Temperature Compensation of Aluminum Nitride Lamb Wave Resonators Utilizing the Lowest-Order Symmetric Mode", Electrical Engineering and Computer Sciences University of California at Berkeley, Dec. 14, 2012, 94 pages.

* cited by examiner

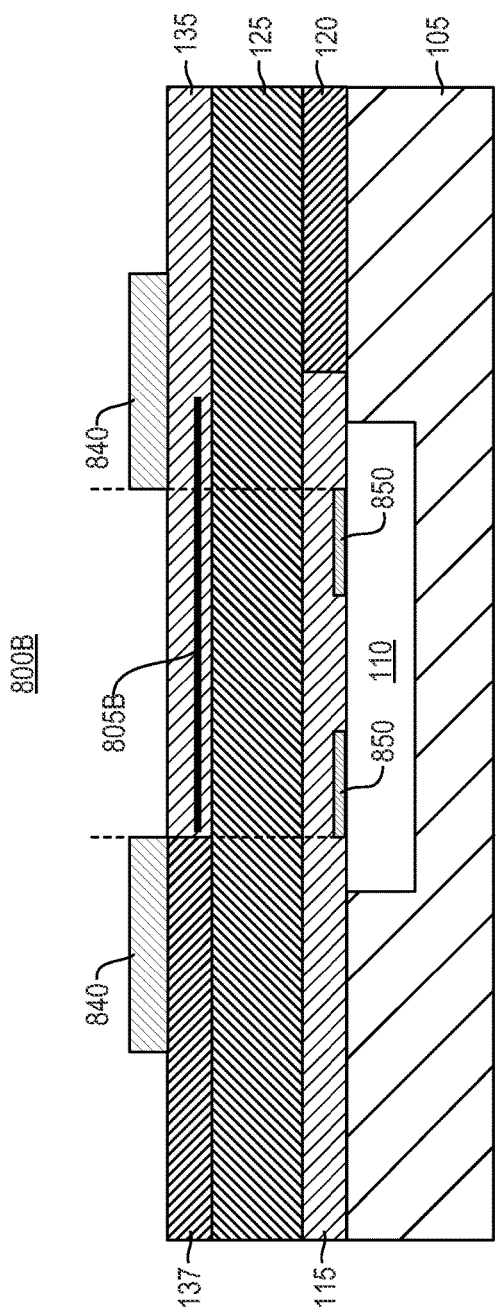

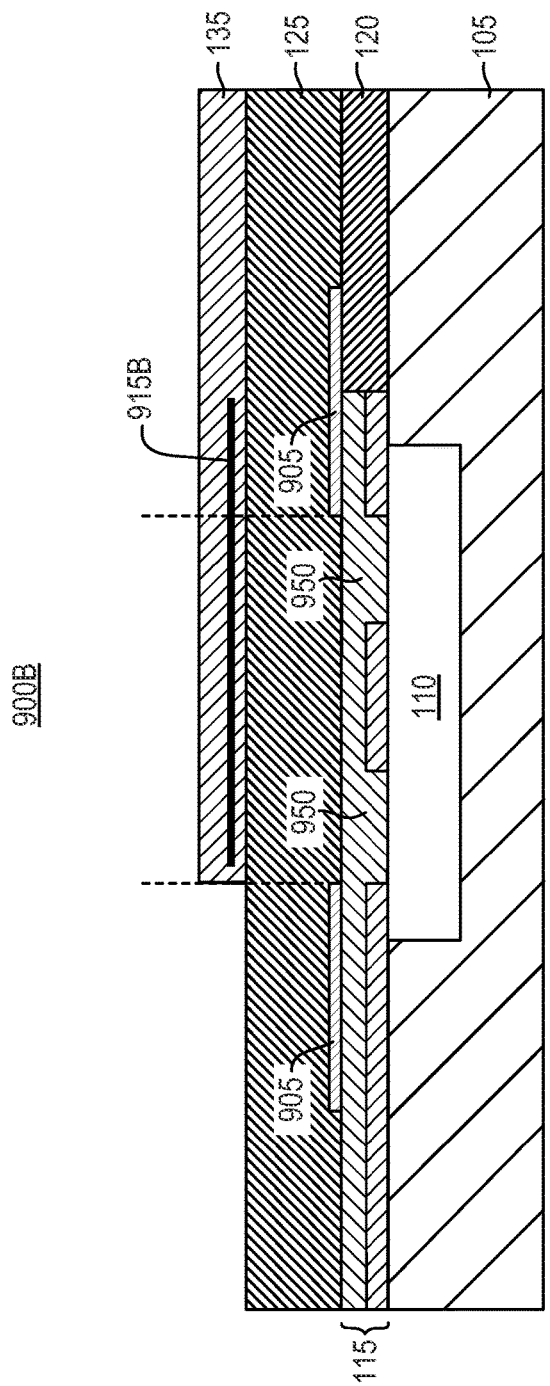

ACOUSTIC RESONATOR COMPRISING INTEGRATED STRUCTURES FOR IMPROVED PERFORMANCE

CROSS REFERENCE TO RELATED APPLICATIONS

This application is a continuation-in-part under 37 C.F.R. §1.53(b) of commonly owned U.S. Pat. No. 9,246,473 entitled "Acoustic Resonator Comprising Collar, Frame and Perimeter Distributed Bragg Reflector," filed on Jul. 31, 2013, which is a continuation-in-part of commonly owned U.S. Pat. No. 9,490,771 entitled "Acoustic Resonator Having Collar and Frame," filed on Feb. 28, 2013, which is a continuation-in-part of commonly owned U.S. Pat. No. 9,409,692 entitled "Acoustic Resonator Having Collar Structure," filed on Oct. 29, 2012, which are hereby incorporated by reference in their entireties. U.S. Pat. No. 9,246,473 is also a continuation-in-part under 37 C.F.R. §1.53(b) of commonly owned U.S. Pat. No. 9,083,302 entitled "Stacked Bulk Acoustic Resonator Comprising a Bridge and an Acoustic Reflector along a Perimeter of the Resonator," filed on Aug. 12, 2011, which is a continuation-in-part application of commonly owned U.S. Pat. No. 9,136,818 "Stacked Acoustic Resonator Comprising Bridge," filed on Mar. 29, 2011, which are hereby incorporated by reference in their entireties. This application is also a continuation-in-part under 37 C.F.R. §1.53(b) of commonly owned U.S. Pat. No. 9,444,426 entitled "Acoustic Resonator Having Integrated Lateral Feature and Temperature Compensation Feature", filed on Feb. 14, 2013, which is a continuation-in-part of U.S. Pat. No. 9,425,764, entitled "Acoustic Resonator having Composite Electrodes with Integrated Lateral Features," filed on Oct. 25, 2012, which are hereby incorporated by reference in their entireties. Applicants claim priority under 35 U.S.C. §120 from U.S. Pat. Nos. 9,246,473 and 9,444,426.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs). An FBAR, for example, includes a piezoelectric layer between a first (bottom) electrode and a second (top) electrode over a cavity. BAW resonators may be used in a wide variety of electronic applications, such as cellular telephones, personal digital assistants (PDAs), electronic gaming devices, laptop computers and other portable communications devices. For example, FBARs may be used for electrical filters and voltage transformers.

An acoustic resonator typically comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, an acoustic resonator comprises different lateral regions that may be subject to different types of resonances, or resonance modes. These lateral regions can be characterized, very broadly, as a main membrane region and peripheral regions, where the main membrane region is defined, roughly, by an overlap between the two plate electrodes and the piezoelectric material, and the peripheral regions are defined as areas outside the main membrane region. Two peripheral regions, in particular, are defined as a region located between the edge of the main membrane region and edge of the air-cavity, and a region of an overlap of at least one plate electrode and the piezoelectric material with the substrate. The main membrane region is subject to electrically excited modes generated by the electric field between the two plate electrodes, and both the main membrane and the peripheral regions are subject to certain derivative modes generated by scattering of energy in the electrically excited modes. The electrically excited modes comprise, for instance, a piston mode formed by longitudinal acoustic waves with boundaries at the edges of the main membrane region. The derivative modes comprise, for instance, lateral modes formed by lateral acoustic waves excited at the edges of the main membrane region and the peripheral regions.

The lateral modes facilitate continuity of appropriate mechanical particle velocities and stresses between the electrically driven main membrane region and the essentially non-driven peripheral regions. They can either propagate freely (so called propagating modes) or exponentially decay (so called evanescent and complex modes) from the point of excitation. They can be excited both by lateral structural discontinuities (e.g., an interface between regions of different thicknesses in the main membrane region, or an edge of a top or bottom electrode) or by electric field discontinuities (e.g., an edge of a top electrode where the electric field is terminated abruptly).

The lateral modes generally have a deleterious impact on the performance of an acoustic resonator. Accordingly, some acoustic resonators include ancillary structural features designed to suppress, inhibit, or mitigate the lateral modes. For example, a collar may be formed by a dielectric material outside the boundary of the main membrane region to allow a smooth decay of evanescent modes emanating from the boundary and improve confinement of mechanical motion to the main membrane region. In another example, a frame may be formed by a conductive or dielectric material within the boundary of the main membrane region to minimize scattering of electrically excited piston mode at top electrode edges and improve confinement of mechanical motion to the main membrane region.

The conventional implementation of these ancillary structural features has a number of potential shortcomings. For instance, depending on their specific design, they may be a source of additional scattering of the piston mode which may outweigh their benefits. Additionally, they may require the presence of certain additional materials that can deleteriously redistribute the acoustic energy in the acoustic stack, such as relatively soft planarization layers. Also, some design choices may produce only modest performance improvements while significantly driving up cost. Moreover, the formation of ancillary structural features may degrade structural stability or interfere with the formation of overlying layers.

In addition, conventional FBARs rely on strong confinement of electrically excited piston mode. Strong confinement is provided by the edges of the top and bottom electrodes, as well as ancillary structural features, such as air-bridges and conventional outside frames. While the apparent advantage of strong confinement is that it prevents strong electrical excitation of mechanical motion at the edge of the top electrode, it also provides significant acoustic discontinuities, leading to scattering of energy out of the desired piston mode into undesired extensional, shear, flexural and dilatational modes of the whole structure. Accordingly, in view of these and other shortcomings of conventional acoustic resonator structures, there is a general need for improved acoustic resonator designs.

In some applications, FBAR filters in particular need to guarantee sufficiently low insertion loss (IL) across temperature ranges, as well as frequency ranges. Typically, as ambient temperature increases, sound velocity of most materials decreases and the cutoff frequency of each of the FBARs forming the filter decreases. Thus, as the temperature increases, the pass-band of the filter generally moves towards lower frequencies. Therefore, in the absence of temperature compensation, the pass-band must be designed wide enough to allow for changes of the ambient temperature, requiring high a coupling coefficient $kt^2$ of each FBAR, which may be difficult to achieve. Also, in some cases (e.g., Band 13), the pass-band may not be allowed to move to prevent encroachment on other (e.g. safety) bands. Temperature compensation of the filter (and therefore each FBAR) is sometimes required. For example, boron-doped silicon oxide $SiO_x$ may be added as a temperature compensating layer to the FBAR. The sound velocity of temperature compensating layer increases with temperature, which yields the desired stabilization of resonator and filter response with changes in ambient temperature. The temperature compensating layer may be embedded into either top or bottom electrode, with all the associated process complications. The ancillary structural features designed to suppress, inhibit, or mitigate the above-mentioned lateral modes are then used to improve parallel resistance Rp and quality factor Q. However, in many practical applications there exists a tradeoff between temperature compensation and the electrical performance of the resonator. For example, in RF filters designed to operate in the range between approximately 500 MHz and 5 GHz for mobile applications the worst insertion loss occurs usually at the low- and high-frequency corners of the filter's passband. To achieve a sufficiently low insertion loss across temperature ranges at these corners, the resonator response needs to be either temperature compensated or the resonator needs to have low insertion loss over a wider frequency ranges. Thus a temperature compensating layer with a subset of ancillary structural features aimed at improving the performance of the resonator, or a different set of ancillary structural features without temperature compensating layer may be used in order to meet specific cost and performance requirements of a final application.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 8B is a cross-sectional view of an acoustic resonator structure according to a representative embodiment.

FIG. 9B is a cross-sectional view of an acoustic resonator structure according to a representative embodiment.

DETAILED DESCRIPTION

Figure 1A:
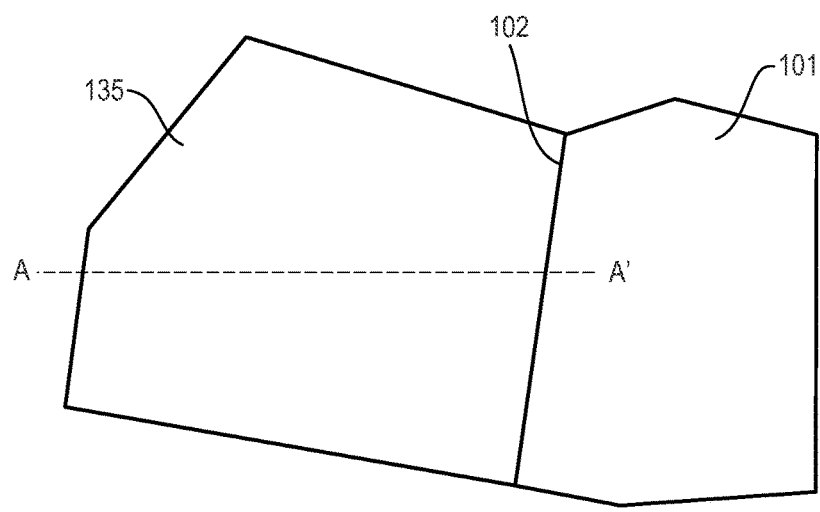
FIG. 1A is a top view of an acoustic resonator structure according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The disclosed embodiments relate generally to acoustic resonators such as FBARs, DBARs, CRFs, and SMRs. For simplicity of explanation, several embodiments are described in the context of FBAR technologies; however, the described concepts can be adapted for use in other types of acoustic resonators. Certain details of acoustic resonators as well as related materials and methods of fabrication may be found in one or more of the following commonly owned U.S. Patents, Patent Application Publications and Patent Applications: U.S. Pat. No. 6,107,721, to Lakin; U.S. Pat. Nos. 5,587,620, 5,873,153 and 6,507,983 to Ruby et al.; U.S. Pat. No. 7,629,865 to Ruby et al.; U.S. Pat. No. 7,280,007 to Feng et al.; U.S. Patent App. Pub. No. 2007/0205850 to Jamneala et al.; U.S. Pat. No. 7,388,454 to Richard C. Ruby et al; U.S. Patent App. Pub. No. 2010/0327697 to Choy et al.; and U.S. Patent App. Pub. No. 2010/0327994 to Choy et al. Examples of DBARs and CRFs as well as their materials and methods of fabrication, may be found in U.S. Pat. No. 7,889,024 to Paul Bradley et al., U.S. Pat. No. 8,575,820 to Shirakawa et al., U.S. Patent Application Publication No. 2012/0218056 to Burak et al., U. S. Patent Application Publication No. 2012/0218055 to Burak et al., U.S. Patent Application Publication No. 2012/0280767 to Burak et al., and U.S. Pat. No. 8,330,325 to Burak et al. Examples of various ancillary structural features that may be included in acoustic resonators are disclosed in U.S. patent application Ser. No. 13/766,993 of Burak et al., filed on Feb. 14, 2013, U.S. patent application Ser. No. 13/663,449 of Burak et al., filed on Oct. 29, 2012, U.S. patent application Ser. No. 13/781,491 of Burak et al., filed Feb. 28, 2013, and U.S. patent application Ser. No. 13/955,774 of Burak et al., filed Jul. 31, 2013, U.S. patent application Ser. No. 13/663,449 to Burak et al., filed on Oct. 29, 2012, and U.S. patent application Ser. No. 13/660,941 to Burak et al., filed on Oct. 25, 2012. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

In certain embodiments described below, an acoustic resonator structure comprises an acoustic stack and various ancillary features formed in or around the acoustic stack to improve its performance. For example, in some embodiments, an acoustic reflector is formed around an air cavity below a main membrane region of the acoustic stack, and at least one air-bridge is formed above the acoustic reflector and the air cavity and across a boundary of the main membrane region. In some related embodiments, a collar is additionally formed outside the main membrane region, with an inner edge substantially aligned with a boundary of or overlapping the main membrane region.

In some other embodiments, a frame is disposed within the main membrane region with an outer edge substantially aligned with a boundary of the main membrane region, a collar is formed separate from the frame, outside the main membrane region, and with an inner edge substantially aligned with the boundary of or overlapping the main membrane region, and a temperature compensation feature is formed in at least one layer of the acoustic stack. The use of the above ancillary features in combination with each other can improve the performance of an acoustic resonator by allowing beneficial characteristics of one feature to compensate for deleterious characteristics of other features, and vice versa, as will be apparent from the following description.

In yet other embodiments described below, an acoustic resonator comprises a piezoelectric layer disposed between top and bottom electrodes, a temperature compensating feature disposed in or between the bottom electrode, the piezoelectric layer and/or the top electrode, and a collar disposed outside a main membrane region and/or a frame disposed within the main membrane region. The collar typically has an inner edge substantially aligned with a boundary of the main membrane region or somewhat overlapping the main membrane region, and the frame typically has an outer edge substantially aligned with the boundary of the main membrane region. The cavity may be disposed within the main membrane region.

Figure 1B:
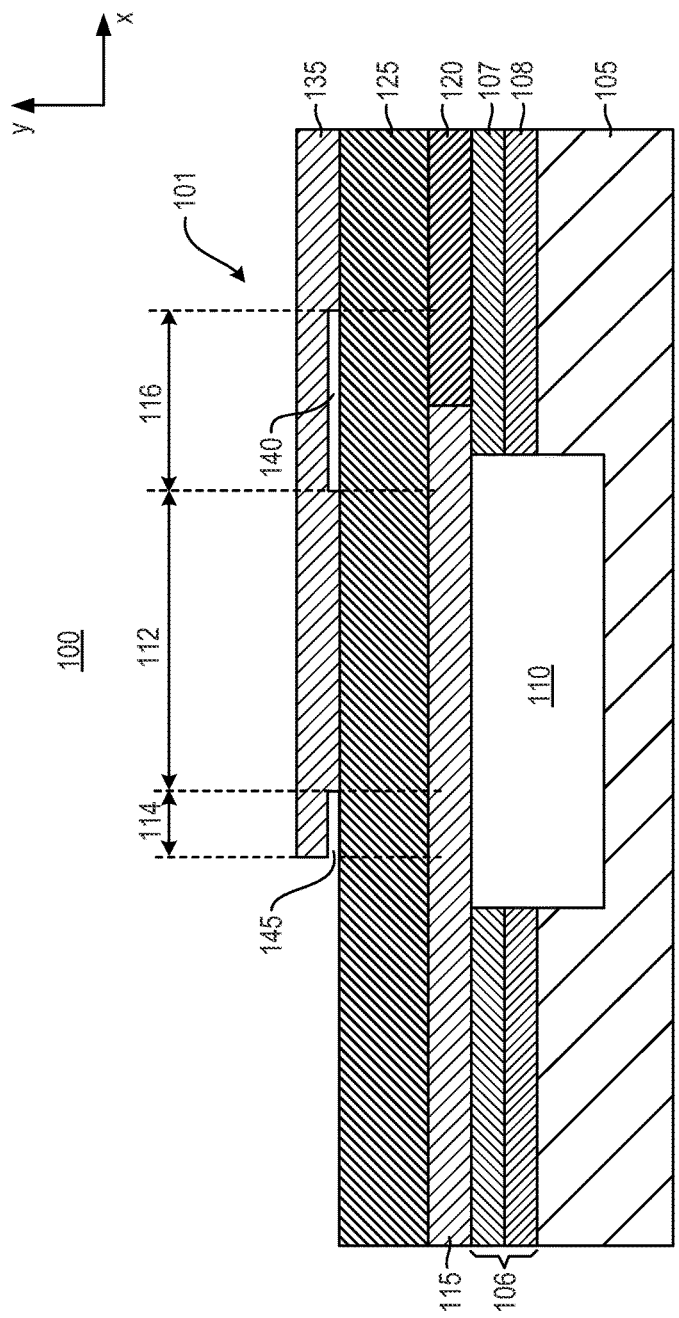
FIG. 1B is a cross-sectional view of an acoustic resonator structure according to a representative embodiment.

FIG. 1A is a top view of an acoustic resonator structure 100 according to representative embodiment, and FIG. 1B is a cross-sectional view of acoustic resonator structure 100.

Referring to FIG. 1A, acoustic resonator structure 100 comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1A) of acoustic resonator structure 100.

The five sides of top electrode 135 have different lengths, forming an apodized pentagon shape. In alternative embodiments, top electrode 135 may have a different number of sides. Although not shown in the drawings, other embodiments of acoustic resonator structures, such as those of FIGS. 2-7 and 9-11, may have an appearance similar to that of FIG. 1A when viewed from the top.

Referring to FIG. 1B, acoustic resonator structure 100 (e.g., an FBAR) comprises a substrate 105 defining an air cavity 110, a perimeter distributed Bragg reflector (DBR) 106 disposed on substrate around air cavity 110, a bottom electrode 115 disposed on perimeter DBR 106 over substrate 105 and air cavity 110, a planarization layer 120 disposed adjacent to bottom electrode 115, a piezoelectric layer 125 disposed on bottom electrode 115 and planarization layer 120, a top electrode 135 disposed on piezoelectric layer 125, a planarization layer 137 (see FIG. 2A) disposed on piezoelectric layer 125 adjacent to top electrode 135, and an air-bridge 140 and air-wing 145 disposed between piezoelectric layer 125 and top electrode 135. Although not shown, a passivation layer may be present on top of top electrode 135 with thickness sufficient to insulate all layers of the resonator stack from the environment, including protection from moisture, corrosives, contaminants, debris and the like. Collectively, bottom electrode 115, piezoelectric layer 125, and top electrode 135 constitute an acoustic stack of acoustic resonator structure 100.

A double-headed arrow indicates a main membrane region 112 of acoustic resonator structure 100, and dotted vertical lines indicate a boundary of the main membrane region. Double-headed arrows and indicate an air-wing region 114 and an air-bridge region 116, respectively, and dotted vertical lines indicate boundaries of these regions. As illustrated in FIG. 1B, air-bridge 140 and air-wing 145 have respective inner edges that are substantially aligned with the boundaries of the main membrane region.

During typical operation of acoustic resonator structure 100 (e.g., as a part of a ladder filter), an input electrical signal is applied to an input terminal of bottom electrode 115 and top electrode 135 is connected to the output terminal. The input electrical signal typically comprises a time-varying voltage that causes vibration in the main membrane region. This vibration in turn produces an output electrical signal at an output terminal of top electrode 135. The input and output terminals may be connected to bottom and top electrodes 115 and 135 via connection edges that extend away from the main membrane region as shown in FIG. 1B. The input and output terminals of acoustic resonator structure 100 may be connected to appropriate terminals of other acoustic resonators forming the ladder filter, for instance.

In a conventional FBAR, the electrically excited piston mode is terminated at the edges of a region where bottom electrode 115, piezoelectric layer 125 and top electrode 135 overlap. The structural discontinuities formed by these edges present significant discontinuities in cutoff frequencies between the main membrane and peripheral regions, and they cause excitation of lateral modes in both the main membrane and peripheral regions to facilitate continuity of appropriate particle velocity and stress components at the interface between these regions. This can lead to undesirable scattering of acoustic energy from the piston mode and the resulting degradation of electrical response of acoustic resonator structure 100. Nevertheless, as will be apparent from the following description of FIGS. 1A and 1B, the combined presence of air-bridge 140, air-wing 145, and perimeter DBR 106 can be used to address these and other forms of scattering and related degradation of performance. Moreover, as will be apparent from the description of other embodiments, additional structures such as collars, temperature compensating features, and frames, can also be used in various combinations to address the above and other forms of scattering and related degradation of performance.

Substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008), to Grannen et al., which is hereby incorporated by reference in its entirety.

Planarization layers 120 (FIGS. 1B through 6B, and FIGS. 8A through 10D), 137 (FIGS. 2B through 4B, and FIGS. 8A through 8D), 137A (FIG. 2B), 605 (FIGS. 6A and 6B) and 120' (FIGS. 10A through 10D) may be formed of borosilicate glass (BSG), for example. Planarization layer 120 is not strictly required for the functioning of acoustic resonator structure 100, but its presence can confer various benefits. For instance, the presence of planarization layer 120 tends to improve the structural stability of acoustic resonator structure 100, may improve the quality of growth of subsequent layers, and may allow bottom electrode 115 to be formed without its edges extending beyond air cavity 110. Further examples of potential benefits of planarization are presented in U.S. Patent App. Pub. No. 2013/0106534 to Burak et al., which is hereby incorporated by reference in its entirety. The bottom and top electrodes 115 and 135 may be formed of one or more electrically conductive metal materials, such as tungsten (W), molybdenum (Mo), copper (Cu) or aluminum (Al). The bottom and top electrodes 115 and 135 electrodes may be formed of the same or different materials.

Piezoelectric layer 125 may be formed of a thin film of piezoelectric material, such as ZnO, AlN or PZT, for example. Of course, other materials may be incorporated into the above and other features of acoustic resonator structure 100 without departing from the scope of the present teachings. Also, in various embodiments, piezoelectric layer 125 may be "doped" with one or more rare earth elements, such as scandium (Sc), yttrium (Y), lanthanum (La), or erbium (Er), for example, to increase the piezoelectric coupling coefficient $e_{33}$ in the piezoelectric layer 125, thereby off-setting at least a portion of the degradation of the electromechanical coupling coefficient $Kt^2$ of the acoustic resonator caused by air-wing 145, collar 405, 415, 505, 610, 615, 840, 905, 1005, frame 845, 850, 850', 945, 950, 950', 1045, 1050, 1050', or the temperature compensating layer 805A, 805B, 805C, or 805D, 915A, 915B, 915C, 915D, 1015A, 1015B, 1015C or 1015D. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al., and U.S. patent application Ser. No. 13/662,460 (filed Oct. 27, 2012), to Grannen et al., which are hereby incorporated by reference in their entireties. Of course, doping piezoelectric layers with one or more rare earth elements may be applied to any of various embodiments, including the embodiments described below with reference to FIGS. 2A through 5B.

Perimeter DBR 106 comprises a first acoustic impedance layer 107 and a second acoustic impedance layer 108 and is designed to provide acoustic isolation between the main membrane region and peripheral regions of acoustic resonator structure 100. The amount of acoustic isolation depends generally on the contrast between the acoustic impedances of adjacent acoustic impedance layers, with a greater amount of contrast creating better acoustic isolation.

For example, first acoustic impedance layer 107 may be formed of silicon oxide (SiO$_x$), where x is an integer, while second acoustic impedance layer 108 paired with first acoustic impedance layer 107 may be formed of tungsten (W) or molybdenum (Mo). In another example, first acoustic impedance layer 107 may be formed of carbon-doped silicon oxide (CDO), while second acoustic impedance layer 108 paired with first acoustic impedance layer 107 may be formed of silicon nitride (SiN$_x$), where x is an integer. A benefit of this pairing of materials is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. Of course, the low and high acoustic impedance materials forming the stacked layers of perimeter DBR 106 may vary without departing from the scope of the present teachings.

Perimeter DBR 106 could alternatively include other numbers of acoustic impedance layers and/or acoustic impedance layer pairs, without departing from the scope of the present teachings. For example, perimeter DBR 106 could be formed of a single quarter-wavelength layer (e.g., having relatively low acoustic impedance), or of multiple pairs of acoustic impedance layers. Where there are additional acoustic impedance layer pairs in the perimeter DBR, each pair likewise includes a first acoustic impedance layer formed of low acoustic impedance material stacked on a second acoustic impedance layer formed of high acoustic impedance material. Various illustrative fabrication techniques of acoustic reflectors are described in U.S. Pat. No. 7,358,831 (Apr. 15, 2008), to Larson III et al., which is hereby incorporated by reference in its entirety. Additionally, perimeter DBR 106 may be included in an acoustic resonator structure 100 of a multi-resonator device. In such a device, first and second acoustic impedance layers 107 and 108 may be electrically isolated from perimeter DBRs of adjacent acoustic resonators. For example, a trench or other isolating structure may be etched around perimeter DBR 106 down to substrate 105.

Air-bridge 140 is disposed on connection side 101, and air-wing 145 is disposed along all remaining sides of acoustic resonator structure 100 (i.e., along a perimeter of acoustic resonator structure 100). Although air-bridge 140 and air-wing 145 are shown with a rectangular cross-section, these structures (and other air-bridges or air-wings described herein) could have other shapes, such as a trapezoidal cross-sectional shape. Examples of alternative shapes, dimensions, and configurations for air-bridge 140 and air-wing 145 are described and illustrated in U.S. Patent Application Publication No. 2012/0218057 by Burak et al., the disclosure of which is hereby incorporated by reference.

Air-bridge 140 essentially minimizes a detrimental impact of a so-called "dead-FBAR" region in which acoustic vibrations of the acoustic resonator may be attenuated through mechanical scattering of the electrically excited piston mode a boundary between the bottom electrode and an underlying substrate (that is, at the edge of air cavity 110) and through the transducer effect in the region where FBAR acoustic stack comprising bottom electrode 115, piezoelectric layer 125 and top electrode 135 overlaps the substrate 105. Air-wing 145 provides a resonant suppression of total motion at the edge of the main membrane region 112, resulting in suppression of flexural, dilatational and complex evanescent modes supported by a outside region, that is region where bottom electrode 115 and piezoelectric layer 125 are surrounded by air from below and above. Both air-bridge 140 and air-wing 145 have widths (x-dimension in FIG. 1B) 116 and 114, respectively, optimized for the best performance of acoustic resonator structure 100.

Air-bridge 140 is typically designed to be wide enough to cross over the bottom electrode 115 edge (as shown in FIG. 1B) and to ensure suitable decay of complex evanescent waves excited at the boundary of main membrane region 112 and air-bridge region 116. Air-wing 145 is typically designed to have a width corresponding to resonant enhancement of parallel resistance Rp resulting from resonant suppression of propagating modes supported by main membrane region 112 and the outside regions. However, if air-bridge 140 or air-wing 145 is too wide, reliability issues can arise and can also limit the placement of similar FBARs (not shown) from being placed in proximity (thus unnecessarily increasing the total area of a chip). In addition, increased width of air-wing 145 generally results in decrease in the electromechanical effective coupling coefficient kt$^2$ due to increased through-air capacitive coupling of top electrode 135 with a stack comprising piezoelectric layer 125 and bottom electrode 115, which in turn results in a degradation of insertion loss (S$_{21}$) of a filter comprising FBARs. Thus, in general, optimum width of air-bridge 140 and air-wing 145 may be determined experimentally and numerically to meet the electrical performance and reliability requirements of the product comprising acoustic resonator structure 100.

Air-bridge 140 and air-wing 145 each have a height (y-dimension in FIG. 1B) with a lower limit determined by limits of the process of releasing sacrificial material in the forming of these structures, and an upper limit determined by the quality of layers grown over these structures and by the quality of subsequent processing of possibly non-planar structures.

Air-bridge 140 and air-wing 145 typically define a perimeter along the main membrane region of acoustic resonator structure 100. The main membrane region thus comprises the portions of the acoustic resonator disposed over the air cavity 110 and bounded by the perimeter provided by air-bridge 140 and air-wing 145. Accordingly, the main membrane region is bordered around its perimeter by an acoustic impedance discontinuity created at least in part by air-bridge 140 and air-wing 145, and above and below (air cavity 110) by an acoustic impedance discontinuity due to the presence of air. Thus, a resonant cavity is beneficially provided in the main membrane region of the acoustic resonator structure 100.

In the depicted embodiment, air-bridge 140 and air-wing 145 are unfilled, i.e., they contain air. In other embodiments, these structures may be "filled", e.g., with a dielectric or metal material to provide the desired acoustic impedance discontinuity. It is noted that the described structures do not necessarily have to extend along all edges of acoustic resonator structure 100. For example, they may be provided on only a subset of the five-sided acoustic resonator structure 100 shown in FIG. 1A.

The acoustic impedance mismatches provided by air-bridge 140 and air-wing 145 cause reflection and suppression of acoustic waves at the boundary that may otherwise propagate out of the main membrane region and be lost, resulting in energy loss. Accordingly, air-bridge 140 and air-wing 145 may serve to suppress excitation on unwanted propagating modes in the main membrane region 112 and outside regions, resulting in better energy confinement within the main membrane region of acoustic resonator structure 100 and reduction of energy losses to acoustic radiation in acoustic resonator structure 100. Reducing such losses increases the Q-factor of acoustic resonator structure 100. In filter applications of acoustic resonator structure 100, as a result of the reduced energy loss, the insertion loss ($S_{21}$) may be beneficially improved.

Similarly, perimeter DBR 106 generally mitigates acoustic losses in a vertical direction (y-dimension in the coordinate system depicted in FIG. 1B) of acoustic resonator structure 100. The principle of operation of perimeter DBR 106 relies on the fact that, due to destructive interference of an incident acoustic wave, its total amplitude decays exponentially in the direction of propagation through the stack. In general, such beneficial exponential decay of wave amplitude is only possible if the thicknesses of first and second acoustic impedance layers 107 and 108 comprising perimeter DBR 106 are equal to or close to equal to an odd multiple of the quarter wavelength of an incident acoustic wave.

At the bottom of perimeter DBR 106, the wave amplitude is small, thus yielding negligible radiation of acoustic energy into substrate 105. In other words, the acoustic energy incident upon perimeter DBR 106 is being reflected back with only small transmission of acoustic energy into substrate 105. Notably, the beneficial reflectivity properties of perimeter DBR 106 are in general possible for a limited range of frequencies, a specific polarization and a limited range of propagation angles of an incident eigenmode. In practical cases when the range of frequencies is given by a bandwidth of a filter and multiple eigenmodes are being excited in the main membrane region, the optimal thicknesses of the various acoustic impedance layers are found numerically and experimentally.

As mentioned above, first acoustic impedance layer 107 has a comparatively low acoustic impedance and is provided beneath bottom electrode 115 and planarization layer 120, and second acoustic impedance layer 108 has a comparatively high acoustic impedance is disposed beneath first acoustic impedance layer 107. As mentioned above, the use of two acoustic impedance layers (e.g., the first and second acoustic impedance layers 107, 108) is merely illustrative, and perimeter DBR 106 may comprise more than two acoustic impedance layers, or a single acoustic impedance layer. Notably, a plurality of acoustic impedance layers of alternating (e.g., stacked low-high-low-high) acoustic impedances may be provided around the perimeter of air cavity 110. The number of acoustic impedance layers provided for the perimeter DBR is determined by a tradeoff between expected reflection performance (the more layers the better) and cost and processing issues (the fewer layers the cheaper and more straightforward mirror growth and post-processing). Furthermore, depending on the acoustic impedance of substrate 105, second acoustic impedance layer 108 may be foregone, with first acoustic impedance layer 107 being disposed directly over substrate 105.

The amount of acoustic isolation of the excited eigenmodes provided by perimeter DBR 106 also depends on the contrast between the acoustic impedances of the adjacent acoustic impedance layers, with a greater amount of contrast creating better acoustic reflection of the vertical component of the eigenmodes. In some embodiments, first and second acoustic impedance layers 107 and 108 are formed of a pair of dielectric materials having contrasting acoustic impedances. One example of such a pair of dielectric materials comprises alternating layers of sputter-deposited silicon carbide (SiC) and plasma enhanced chemical vapor deposited (PECVD) SiC. Notably, the sputter-deposited SiC layer has a comparatively high acoustic impedance and the PECVD SiC layer has a comparatively low acoustic impedance. As such, according to one embodiment, first acoustic impedance layer 107 comprises PECVD SiC and second acoustic impedance layer 108 comprises sputter-deposited SiC. Another example of such a pair of dielectric layers is CDO and silicon nitride. As such, according to another representative embodiment, first acoustic impedance layer 107 comprises CDO and second acoustic impedance layer 108 comprises silicon nitride.

Perimeter DBR 106 may be formed before air cavity 110 and subsequent layers of acoustic resonator structure 100. In particular, the layers of perimeter DBR 106 are provided over substrate 105 using selected materials deposited by known methods. For example, second acoustic impedance layer 108 may be formed over substrate 105, and first acoustic impedance layer 107 may be formed over second acoustic impedance layer 108. Alternatively, first acoustic impedance layer 107 may be formed over substrate 105 directly. Still alternatively, additional acoustic impedance layers (not shown) may be provided between second acoustic impedance layer 108 and first acoustic impedance layer 107. In all embodiments, however, first acoustic impedance layer 107, which has comparatively low acoustic impedance, is provided beneath bottom electrode 115.

In general, the main membrane region of acoustic resonator structure 100 is defined by the presence of air (essentially zero acoustic impedance material) at both top and bottom boundaries. Therefore vertical stress components are zero at these boundaries. Similarly, through proper selection of materials in perimeter DBR 106, first acoustic impedance layer 107 may have very low acoustic impedance compared to bottom electrode 115, which may also lead to a lowered vertical stress at the boundary between bottom electrode 115 and first acoustic impedance layer 107. Such a lowered stress condition is only possible, however, where the thickness of first acoustic impedance layer 107 is reasonably close to an odd multiple of the quarter wavelength of the fundamental eigenmode, e.g. evanescent thickness extensional (eTE1) or complex thickness extensional (cTE1) modes (depending on additional ancillary structural features, e. g. collars, described below), for which perimeter DBR 106 is designed. Adding more acoustic impedance layers to perimeter DBR 106 further lowers the vertical stress at the interface between bottom electrode 115 and first acoustic impedance layer 107, thus allowing for closer approximation of an ideal zero-stress condition.

In general, the depth of air cavity 110 is determined by the etch properties of the sacrificial material and by possible downward bowing of the released membrane (i.e., layers of acoustic resonator structure 100 disposed over air cavity 110) in the case of residual compressive stress in the layers of the membrane being present. Usually deeper cavities are more beneficial from the membrane release process point of view, but they also yield somewhat more difficult initial etch process. If the above mentioned features of the release process require deeper cavities than the thickness of first acoustic impedance layer 107, one can increase the depth of air cavity 110 by continued etching second acoustic impedance layer 108 and substrate 105 until required distance between bottom electrode 115 and bottom of air cavity 110 is obtained. In various embodiments, a thickness of the perimeter DBR 106 may be substantially the same as the depth of air cavity 110, less than the depth of air cavity 110, or greater than the depth of air cavity 110, without departing from the scope of the present teachings.

Figure 2A:
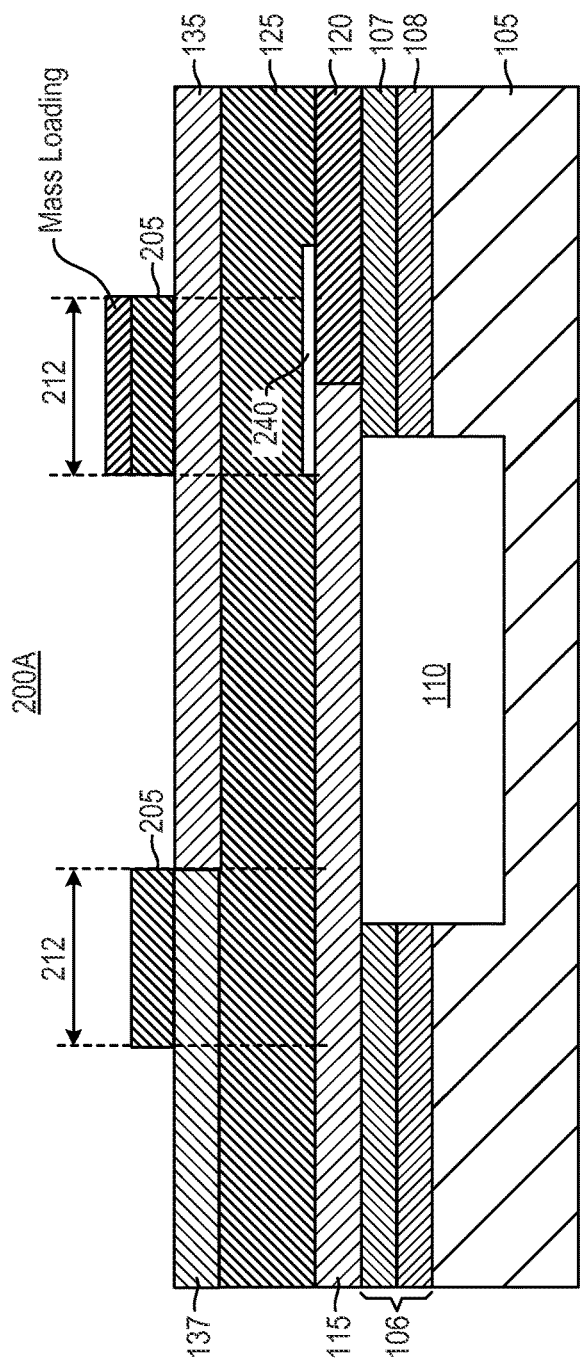
FIG. 2A is a cross-sectional view of an acoustic resonator structure according to a representative embodiment.

FIG. 2A is a cross-sectional view of an acoustic resonator structure 200A according to another representative embodiment.

Referring to FIG. 2A, acoustic resonator structure 200A is similar to acoustic resonator structure 100, except that it further comprises a planarization layer 137 and a collar structure 205. Additionally, air-bridge 140 and air-wing 145 are replaced by an air-bridge 240.

Planarization layer 137 is formed on piezoelectric layer 125 adjacent to top electrode 135. Collar structure 205 is formed in a collar region 212 surrounding the main membrane region of acoustic resonator structure 200A. Although not shown in FIG. 2A, collar structure 205 typically forms a ring around the main membrane region in an apodized shape similar to that illustrated in FIG. 1A.

Planarization layer 137 is typically formed of NEBSG or another suitable planarization material. Planarization layer 137 typically has relatively low acoustic impedance, but it could alternatively be formed of a material having higher acoustic impedance than NEBSG to produce a vertical modal energy distribution across the stack in the region of collar structure 205 that matches more closely a vertical modal energy distribution across the stack in the main membrane region. Such materials, however, are generally mechanically harder and therefore more difficult to use as a planarization layer than NEBSG. For example, when planarizing a relatively hard material using a planarization technique such as chemical mechanical polishing (CMP), it may be difficult to remove all surface imperfections, such as so-called "bat ears" on the corners of certain polished features. Accordingly, in some embodiments, planarization layer 137 may be formed of a composite structure having a first layer of relatively hard material with high acoustic impedance, and a second layer of softer material with lower acoustic impedance, as will be described in relation to FIG. 2B. In other embodiments, collar structure 205 may be formed directly on top of piezoelectric layer 125 and on top of top electrode 135, so acoustic resonator structure 200A may omit planarization layer 137.

Collar structure 205 is formed of a dielectric material, typically one with relatively high acoustic impedance. For example, it may be formed of silicon carbide, silicon nitride, aluminum nitride, aluminum oxide, zinc oxide or diamond-like carbon. Collar structure 205 can be formed by depositing a thin etch stop layer (e.g., 300 Å of AlN if silicon carbide is used to form a collar) and then depositing a layer of the collar dielectric layer over planarization layer 137 and top electrode 135. Then, dry etching is used to define a desired pattern of collar structure 205. After collar structure 205 is formed, an optional passivation layer may be deposited (not shown in FIG. 2A) and ion-milling may be performed to fine-tune the frequency response of a filter, for instance, comprising one or more acoustic resonator structure 200A. Of course, various other techniques may be incorporated to form collar structure 205, as would be apparent to one of ordinary skill in the art. For example, the order of depositing and forming a layer of collar structure 205 and depositing a passivation layer may be reversed.

Collar structure 205 is typically designed so that its cut-off frequency is substantially the same as the cutoff frequency in the main membrane region, and its main non-propagating mode (evanescent mode, for instance) has substantially the same modal distribution as the piston mode in the main membrane region. This prevents acoustic energy in the piston mode from being converted into unwanted propagating modes in the collar region and propagating and evanescent modes in the main membrane region. If excited, propagating modes in the collar region in general may lead to energy loss due to acoustic radiation to the region outside of acoustic resonator structure 200A. Similarly, if excited, propagating and evanescent modes inside the main membrane region may in general produce lateral voltage gradients, which may lead to lateral current flows and energy loss due to the Joule heating. Thus, collar structure 205 may improve confinement of the piston mode within the main membrane region while suppressing the excitation of unwanted spurious lateral modes inside and outside of the main membrane region. This, in turn, may reduce overall acoustic scattering loss and enhance the parallel resistance Rp and the quality factor (Q-factor) of the acoustic resonator structure 200A.

The presence of air-bridge 240 on the top electrode 135 connection side 101 generally increases the cutoff frequency in the corresponding part of collar region 212 due to removing the bottom electrode 115 from the acoustic stack of the acoustic resonator structure 200A. To compensate for that frequency increase, additional dielectric or metal layer can be deposited over the air-bridge 240 region to substantially match the cutoff frequency in that region with the cutoff frequency of the main membrane region. Thus, the use of mass loading, in combination with air-bridge 240, tends to maintain the cutoff frequency of the corresponding peripheral region at a level similar to that of the membrane region while beneficially increasing quality factor Q and parallel resistance Rp due to elimination of piston mode scattering at top electrode 135 connection side 101.

Figure 2B:
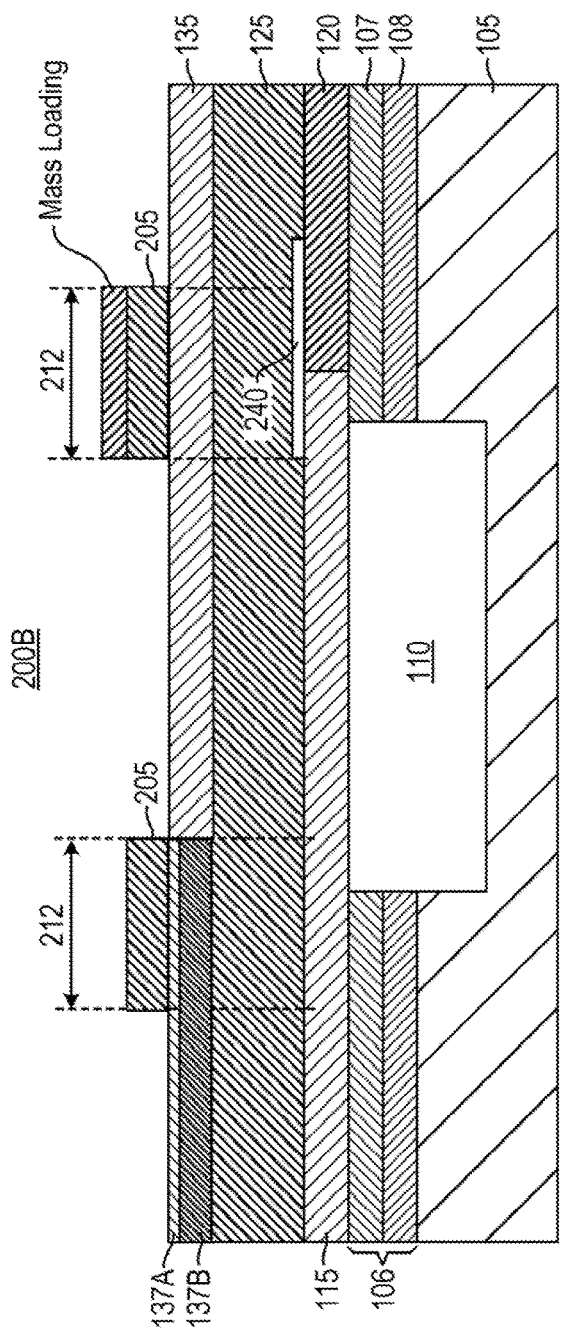
FIG. 2B is a cross-sectional view of an acoustic resonator structure according to a representative embodiment.

FIG. 2B is a cross-sectional view of an acoustic resonator structure 200B according to a representative embodiment. FBAR 200B is substantially the same as acoustic resonator structure 200A, except that planarization layer 137 is formed with a composite structure. Although not shown in the drawings, other embodiments including planarization layer 137 may be similarly modified to include a composite structure such as that illustrated in FIG. 2B.

Referring to FIG. 2B, planarization layer 137 comprises a first layer 137A and a second layer 137B. First layer 137A is formed by depositing a material of high acoustic impedance on piezoelectric layer 125 and top electrode 135 of FBAR 200B. The high acoustic impedance layer may be, for instance, silicon carbide, silicon nitride, aluminum nitride, aluminum oxide, zinc oxide or diamond-like carbon. Second layer 137B is then formed by depositing a material of lower acoustic impedance on top of first layer 137A followed by the dry etching to remove both materials from the main membrane region of FBAR 200B. Because second layer 137B is formed of a softer material, it can be readily planarized with top electrode 135 using a technique such as CMP. After planarization layer 137 is formed, collar structure 205 is formed as described in relation to FIG. 2A and then passivation layer (not shown) may be deposited.

The use of a high acoustic impedance material in planarization layer 137 tends to produce a vertical modal energy distribution across the stack in the region of collar structure 205 that matches more closely a vertical modal energy distribution across the stack in the main membrane region. This allows a closer match between a vertical distribution of the electrically excited piston mode in the main membrane region and a vertical distribution of an evanescent thickness extensional (eTE1) mode in the region of collar structure 205 at the frequencies above the series resonance frequency Fs of acoustic resonator structure 200B. The eTE1 mode may then decay exponentially in the direction away from the collar/membrane interface without coupling to other propagating modes supported by the acoustic resonator structure 200B. This in turn may result in overall reduced scattering loss in the collar region and may produce significant improvements in parallel resistance Rp.

Moreover, although not shown in FIG. 2A or 2B, the use of higher acoustic impedance materials in collar structure 205 and the passivation layer can also contribute to improved performance for similar reasons.

In certain alternative embodiments, acoustic resonator structure 200A or 200B may be altered to omit perimeter DBR 106. The omission of perimeter DBR 106 would be accompanied by cost and performance tradeoffs apparent from the description of perimeter DBR 106.

Figure 3:
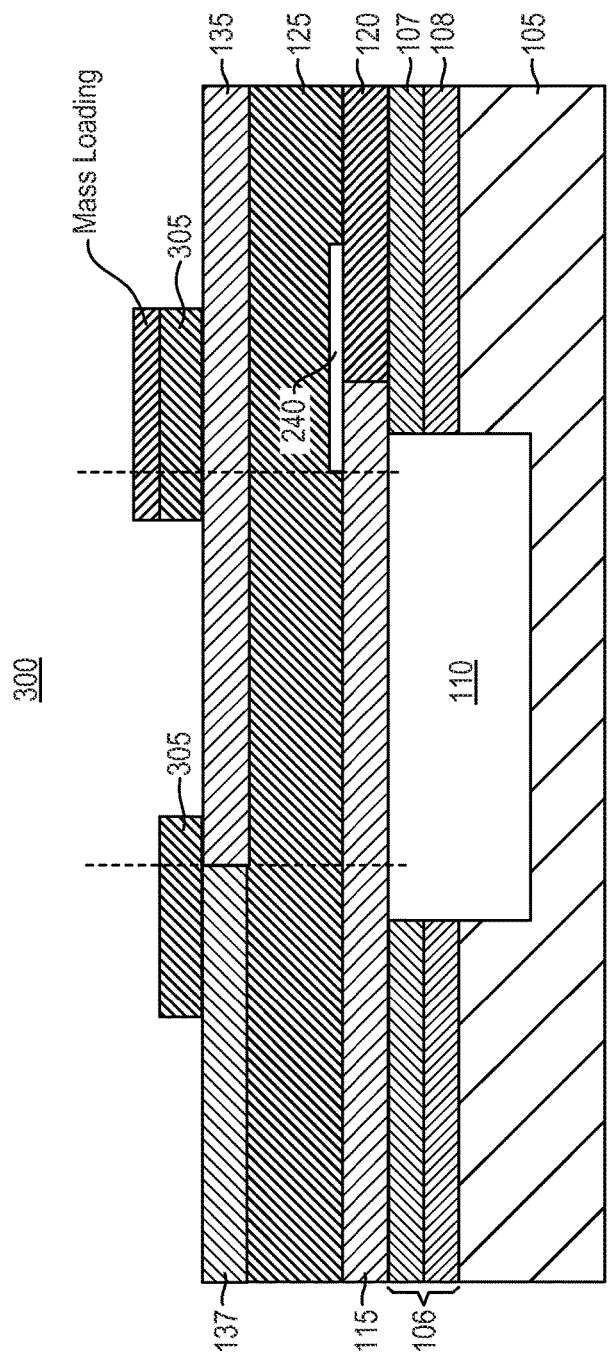
FIG. 3 is a cross-sectional view of an acoustic resonator structure according to a representative embodiment.

FIG. 3 is a cross-sectional view of an acoustic resonator structure 300 according to a representative embodiment.

Referring to FIG. 3, acoustic resonator structure 300 is substantially the same as acoustic resonator structure 200A, except that collar structure 205 is replaced by a collar/frame structure 305. Collar/frame structure 305 differs from collar structure 205 in that it extends over an edge of top electrode 135. This extension is illustrated in FIG. 3 by portions of collar/frame structure 305 within the pair of dotted lines.

As will be described below in relation to FIG. 8A, a frame typically comprises one or more added (or removed) thin layers of material along a perimeter of a resonator device. It can lower (or increase) the cutoff frequency in a corresponding frame region relative to the main membrane. This in turn reduces the amplitude of the electrically excited piston mode and the resulting scattering at top electrode edges above (or below) the cut-off frequency of a membrane. Frames can also create an acoustic impedance mismatch to enable suppression of the amplitudes of propagating and/or evanescent modes (whichever exist in the frequency range of interest) mechanically excited at the membrane/frame boundary, thus further reducing acoustic energy leakage to the outside of the main membrane region.

In relation to FIG. 3 a frame part (i.e., a part extending over the edge of top electrode 135) of the collar/frame structure will suppress the amplitude of the electrically excited piston mode in the frame portion of collar/frame structure 305 as described above, while the collar part will facilitate exponential decay of mechanically excited eTE1 mode at the membrane/collar interface in the region of collar/frame structure 305. Thus a combined collar/frame structure may provide additional suppression of spurious lateral modes, resulting in further improvement of acoustic resonator structure 300 parallel resistance Rp and Q values. On the other hand, depending on materials forming planarization layer 137 and collar/frame structure 305, a cutoff frequency shift in the region where collar/frame structure 305 overlaps the main membrane region of acoustic resonator structure 300 may provide a source of additional acoustic scattering of the piston mode which may outweigh the benefits of having a combined collar/frame structure. That may be the case, for example, where most of the cutoff frequency shift in the collar/frame structure 305 region is due to the presence of collar/frame structure 305 rather than planarization layer 137. Also, this may be the case in embodiments in which planarization layer 137 is skipped and the collar/frame structure 305 is formed directly on piezoelectric layer 125, for instance. Thus the amount of overlap of collar/frame structure 305 with the top electrode 135 may be adjusted experimentally for the best performance for a specific materials and stack design used in acoustic resonator structure 300.

Figure 4A:
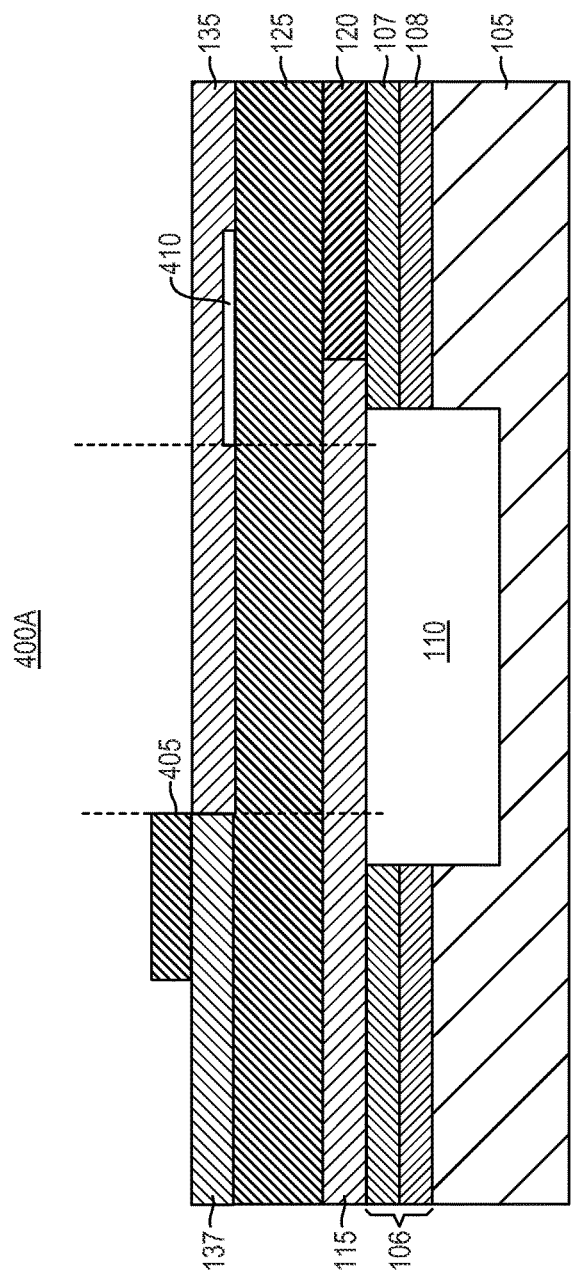
FIG. 4A is a cross-sectional view of an acoustic resonator structure according to a representative embodiment.
Figure 4B:
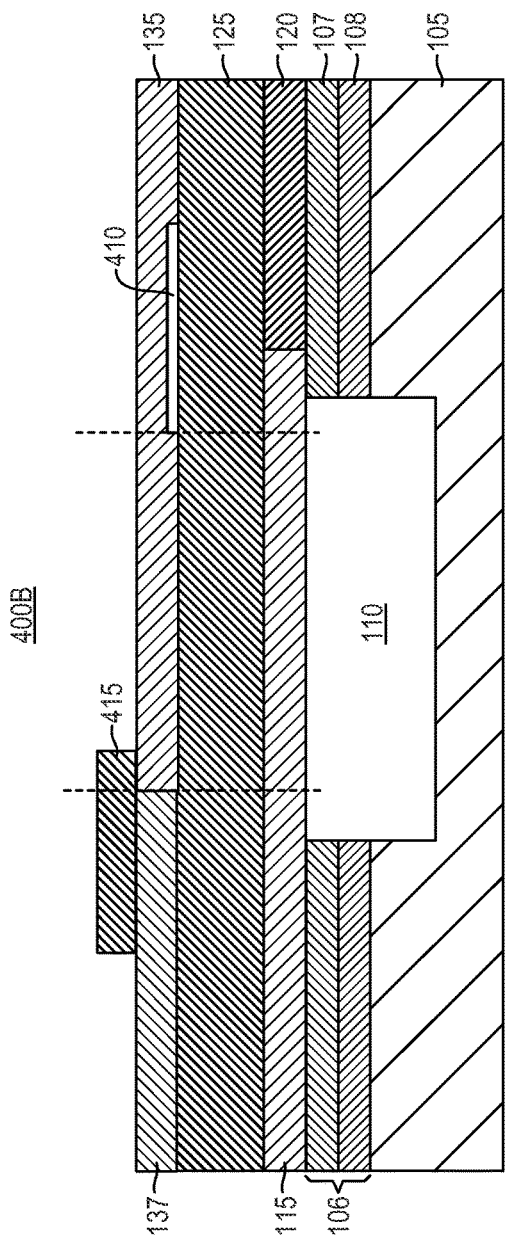
FIG. 4B is a cross-sectional view of an acoustic resonator structure according to a representative embodiment.

FIG. 4A is a cross-sectional view of an acoustic resonator structure 400A according to a representative embodiment, and FIG. 4B is a cross-sectional view of an acoustic resonator structure 400B according to a representative embodiment.

Referring to FIGS. 4A and 4B, acoustic resonator structures 400A and 400B are similar to acoustic resonator structures 200A and 300, respectively, except that each of acoustic resonator structures 400A and 400B omits air-bridge 240, omits a portion of a collar or collar/frame structure on connecting side 101, and includes an air-bridge 410 on connecting side 101 between piezoelectric layer 125 and top electrode 135.

The presence of air-bridge 410 on connecting side 101 has a performance impact similar to that of air-bridge 140 described in relation to FIG. 1B. It can be viewed as an alternative to the combination of air-bridge 240 and the mass loaded portion of collar structure 205 or collar/frame structure 305 in FIGS. 2A and 3. The presence of other features has a performance impact similar to that described with reference to acoustic resonator structures 200A and 300.

Figure 5:
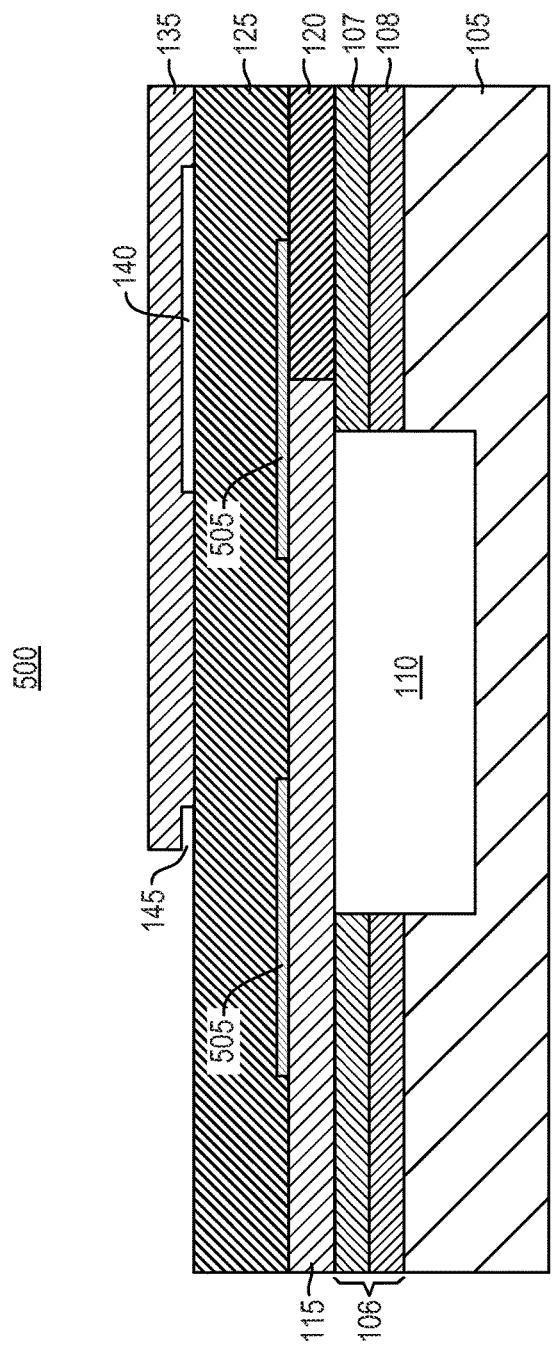
FIG. 5 is a cross-sectional view of an acoustic resonator structure according to a representative embodiment.

FIG. 5 is a cross-sectional view of an acoustic resonator structure 500 according to a representative embodiment.

Referring to FIG. 5, acoustic resonator structure 500 is similar to acoustic resonator structure 100, except that a collar/frame structure 505 is formed between piezoelectric layer 125 and bottom electrode 115 and planarization layer 120. The thickness of collar/frame structure 505 be can adjusted such that respective cutoff frequencies in the active region and the collar region are substantially matched. Collar/frame structure 505 extends into a region below the outer edges of top electrode 135 (i.e., into the active region or main membrane region 112). This extended part constitutes a frame portion of the combined collar/frame structure, and a remaining part constitutes a collar portion.

Collar/frame structure 505 is typically formed by a relatively thin layer of CDO, although other materials may be used in various alternative embodiments. The use of a relatively thin layer, as opposed to a thicker layer, tends to improve the quality piezoelectric layer 125 grown over it. The use of a relatively low acoustic impedance material such as CDO allows the structure to achieve a relatively large frequency shift for relatively small thicknesses of the collar/frame layer. Typically, collar/frame structure 505 layer is deposited following deposition and formation of bottom electrode 115 and planarization layer 120. Dry etch is used to form a desired pattern of collar/frame structure 505 region followed by deposition of piezoelectric layer 125.

Figure 6A:
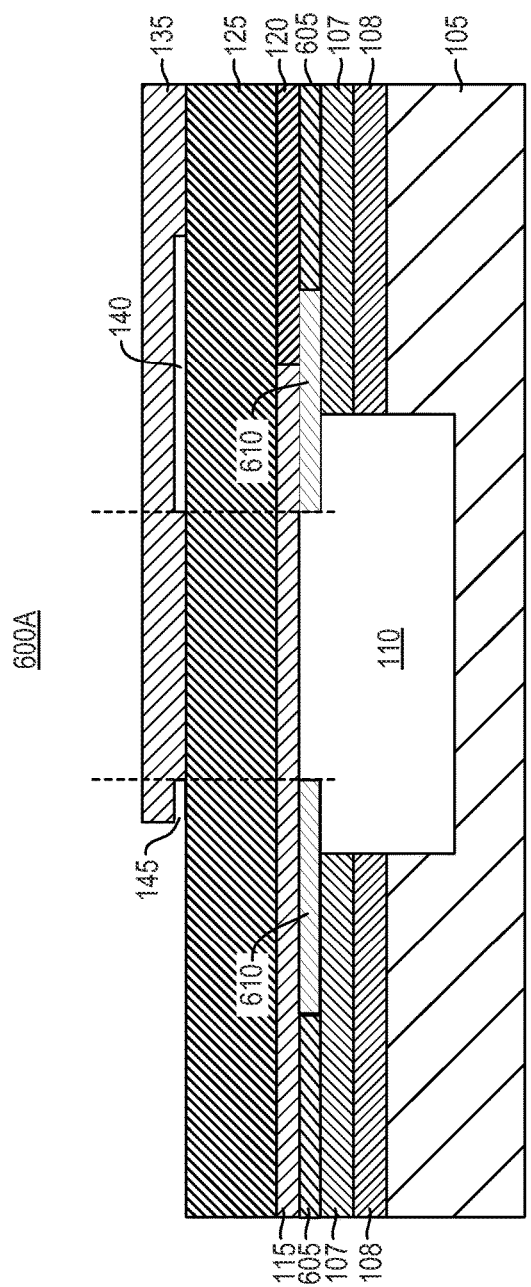
FIG. 6A is a cross-sectional view of an acoustic resonator structure according to a representative embodiment.
Figure 6B:
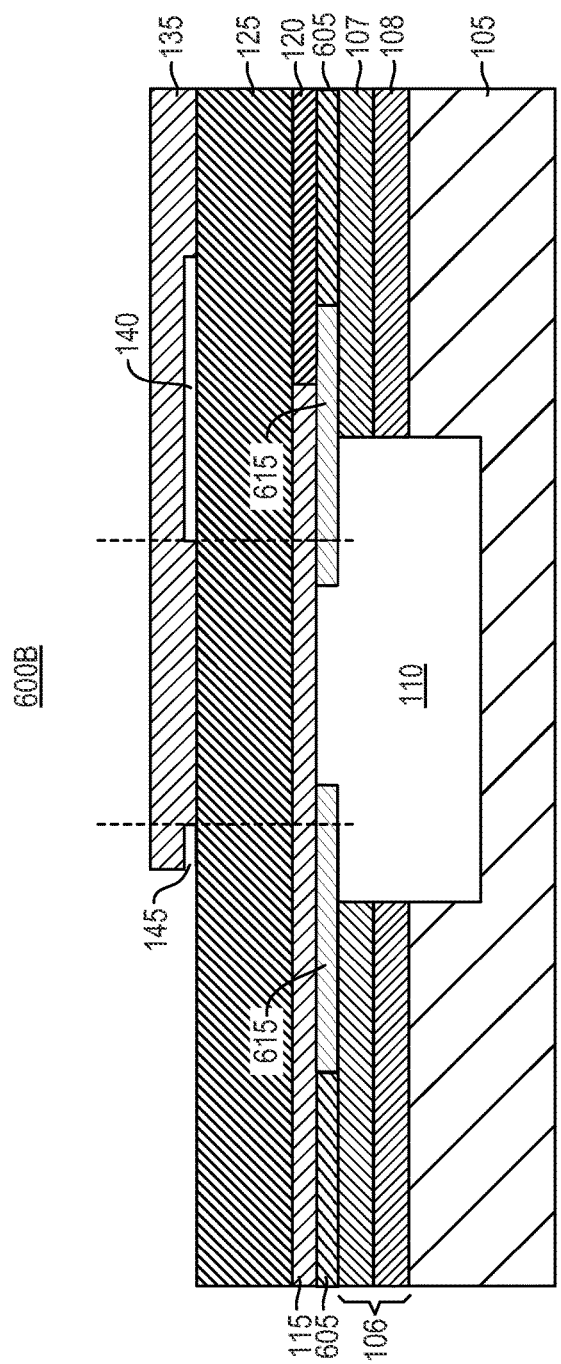
FIG. 6B is a cross-sectional view of an acoustic resonator structure according to a representative embodiment.

FIGS. 6A and 6B are cross-sectional view of an acoustic resonator structure 600A and 600B, respectively, according to representative embodiments.

Referring to FIGS. 6A and 6B, acoustic resonator structures 600A and 600B are similar to acoustic resonator structure 100 of FIG. 1B, except that a collar structure 610 or a collar/frame structure 615 is formed between perimeter DBR 106 and a bottom surface of planarization layer 120 and bottom electrode 115. In addition, part of planarization layer 120 is formed below bottom electrode 115 adjacent to collar structure 610. Similar to other embodiments described above, the width and thickness of collar structure 610 or collar/frame structure 615 can be adjusted such that cutoff frequencies and appropriate mode profiles in the active region and the collar region essentially match. The process of forming collar structure 610 or collar/frame structure 615 can be understood from the description of U.S. patent application Ser. No. 13/663,449, for instance.

Figure 7A:
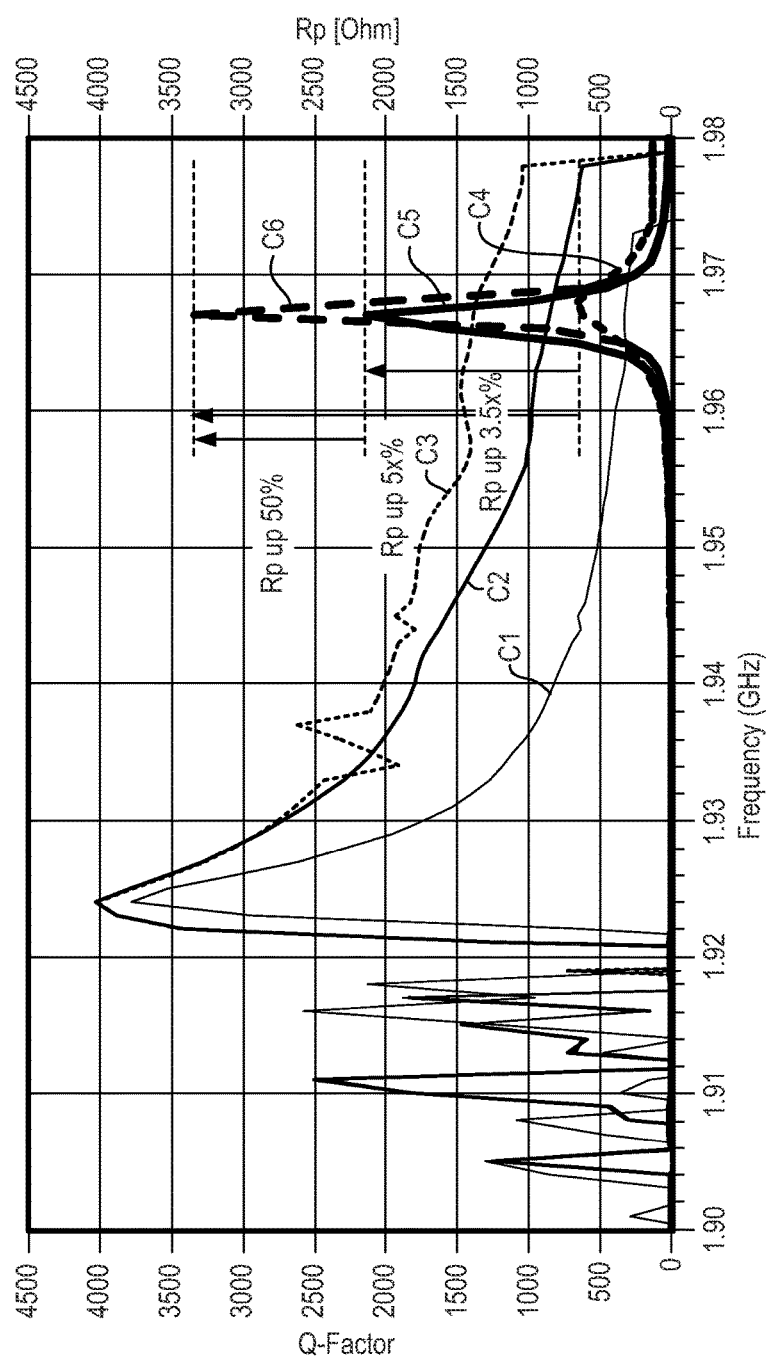
FIG. 7A is a graph illustrating the simulated Q-factor and parallel resistance Rp of a conventional acoustic resonator structure and an acoustic resonator structure according to a representative embodiment.
Figure 7B:
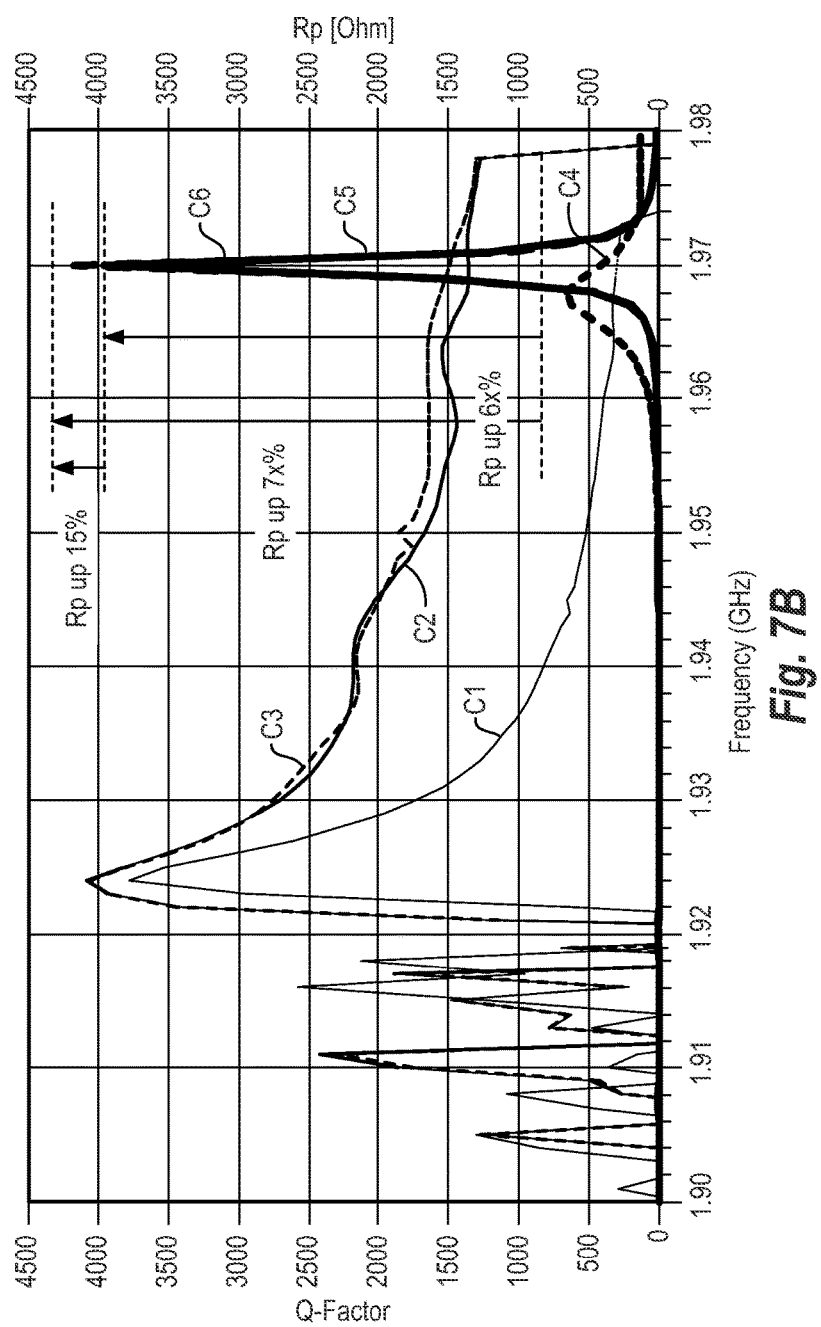
FIG. 7B is a graph illustrating the simulated Q-factor and parallel resistance Rp of a conventional acoustic resonator structure and an acoustic resonator structure according to a representative embodiment.

FIGS. 7A and 7B are graphs illustrating the simulated quality factor Q (or Q-factor) and parallel resistance Rp of various acoustic resonator structures. In each of FIGS. 7A and 7B, Q-factor is represented by a y-axis on the left side, and Rp is represented by a y-axis on the right side. The values of the Q-factor and Rp are shown as a function of input signal frequency.

The simulated structures are all variations of acoustic resonator structure 500 of FIG. 5. These variations include, as a reference device, a conventional acoustic resonator structure without the collar structure, air-bridge, air-wing, and perimeter DBR shown in FIG. 5. FIG. 7A shows a comparison between the simulated Q-factor and parallel resistance Rp of the conventional acoustic resonator structure ("first device", curves C1 and C4), a variation that adds only the collar structure 505 ("second device", curves C2 and C5), and a variation that further adds perimeter DBR 106 ("third device", curves C3 and C6). FIG. 7B shows a comparison between the simulated Q-factor and parallel resistance Rp of the conventional acoustic resonator structure ("first device", curves C1 and C4), a variation that adds collar structure 505 and air-bridge 140 ("second device", curves C2 and C5), and a variation that further adds perimeter DBR 106 ("third device", curves C3 and C6). More specifically, curves C1, C2, and C3 in FIGS. 7A and 7B illustrate Q-factor values, and a peak value in Q-factor curves corresponds to the series resonance frequency Fs of the respective acoustic resonators. Curves C4, C5 and C6 in FIGS. 7A and 7B illustrate magnitudes of complex-valued electrical impedance of the acoustic resonator. At parallel resonance frequency Fp electrical impedance becomes approximately real-valued and the peak value of electrical impedance magnitude indicates parallel resistance Rp of the respective acoustic resonators.

In the examples of FIGS. 7A and 7B, the dimensions of the acoustic resonator structures have been tuned for high Rp. In particular, bottom electrode 115 is formed of Mo with a thickness of approximately 3000 Å, piezoelectric layer 125 is formed of AlN with a thickness of approximately 9300 Å, top electrode 135 is formed of Mo with a thickness of approximately 3250 Å, and a passivation layer is formed over the top electrode of AlN with a thickness of approximately 2000 Å. In each of FIGS. 7A and 7B, the collar structure is formed of CDO with a thickness of 650 Å, a width of 8 µm, and an extension of 7.5 µm over air cavity 110. With regard to alignments, an outer edge of bottom electrode 115 extends approximately 5.5 µm outside air cavity 110, and an outer edge of top electrode 135 extends approximately 5.0 µm within air cavity 110. Air-bridge 140 is formed with a height of 1500 Å and a width of 10.5 µm. It extends 4.5 µm over air cavity 110. None of the simulated structures contains an air-wing 145 shown in FIG. 5.

Referring to FIG. 7A, a peak value of the Q-factor occurs for each of the devices at about 1.924 GHz which represents the series resonance frequency Fs for both devices. A peak value of Rp occurs for each of the devices at about 1.968 GHz, which represent parallel resonant frequencies Fp for each device. At frequencies above Fs, the second and third devices have significantly higher Q-factor than the first device. In addition, as illustrated by the respective peaks of curves C5 and C6, the second and third devices also have significantly higher Rp than the first device. In particular, the second device has 3.5 times higher Rp than the first device, and the third device has 50% higher Rp than the second device. As illustrated by curves C1 through C6, the introduction of the collar structure increases both Q-factor and Rp, while the further introduction of the perimeter DBR further increases Rp and Q-factor for frequencies above series resonance frequency Fs.

Referring to FIG. 7B, a peak value of the Q-factor occurs for each of the devices at about 1.924 GHz, which is similar to that of FIG. 7A. A peak value of Rp occurs for the first device at about 1.968 GHz, and at about 1.97 GHz for the second and third devices. At frequencies above Fs, the second and third devices have significantly higher Q-factor than the first device. In addition, as illustrated by the respective peaks of curves C5 and C6, the second and third devices also have significantly higher Rp than the first device. In particular, the second device has about 6 times higher Rp than the first device, and the third device has about 7 times higher Rp than the first device. Additionally, the maximum values for both Q-factor and Rp in FIG. 7B are higher than those in FIG. 7A. Also, introduction of air-bridge 140 to acoustic resonator structure 500 eliminates "dead-FBAR" and parallel capacitance associated with the region where FBAR acoustic stack overlaps the substrate 105, resulting in beneficial increase of parallel resonance frequency Fp and electromechanical coupling coefficient $Kt^2$ as can be seen by comparing curves C5 and C6 in FIGS. 7A and 7B. Accordingly, as illustrated by curves C1 through C6 in FIG. 7B, the introduction of the air-bridges, in addition to the collar structure and the perimeter DBR increases quality factor Q, parallel resistance Rp, and electromechanical coupling coefficient $Kt^2$.

FIGS. 8A through 8D are cross-sectional views of acoustic resonator structures 800A through 800D according to representative embodiments.

Figure 8A:
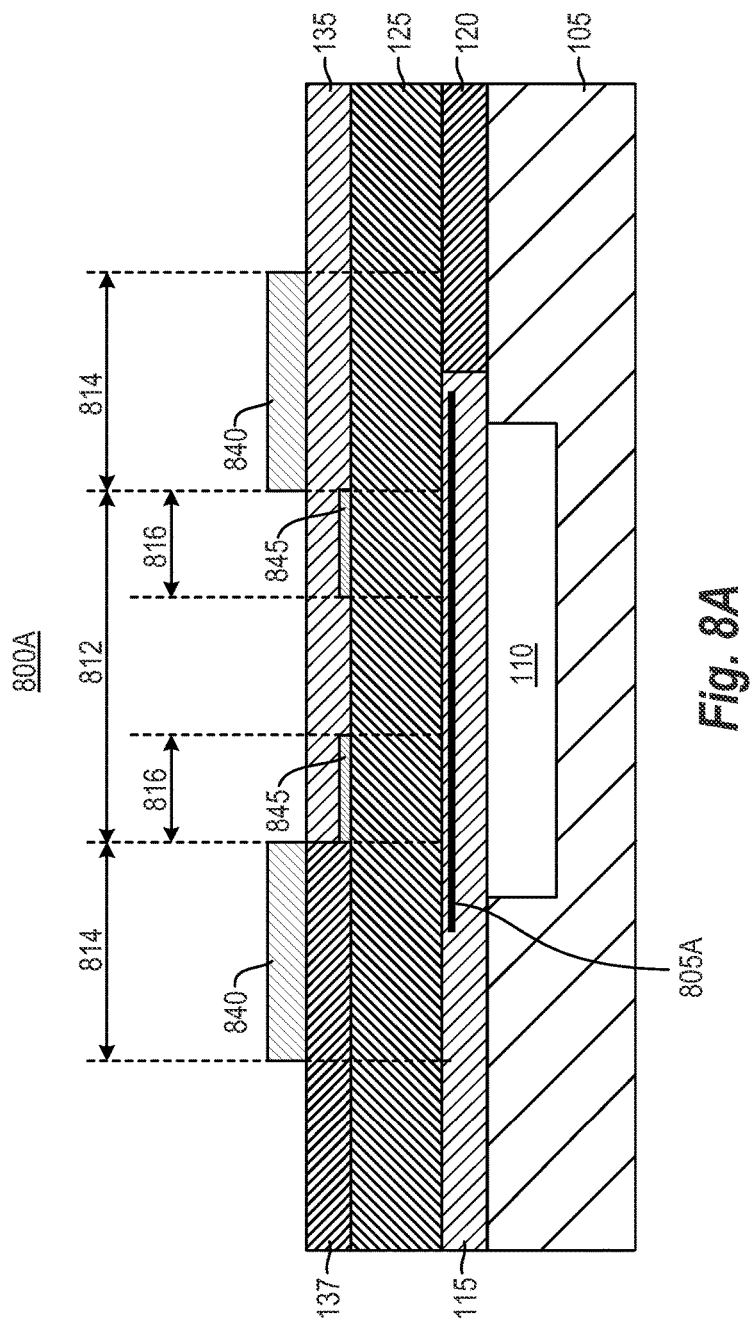
FIG. 8A is a cross-sectional view of an acoustic resonator structure according to a representative embodiment.

Referring to FIG. 8A, acoustic resonator structure 800A comprises substrate 105 having air cavity 110, bottom electrode 115 disposed on substrate 105 over air cavity 110, planarization layer 120 disposed on substrate 105 adjacent to bottom electrode 115, piezoelectric layer 125 disposed on bottom electrode 115 and planarization layer 120, top electrode 135 disposed on piezoelectric layer 125, and planarization layer 137 disposed on piezoelectric layer 125 adjacent to top electrode 135. Collectively, bottom electrode 115, piezoelectric layer 125, and top electrode 135 constitute an acoustic stack of acoustic resonator structure 100. Acoustic resonator structure 800A further comprises a collar structure 840 disposed on planarization layer 137 and top electrode 135, and a frame 845 disposed in a bottom portion of top electrode 135. Although not shown, a passivation layer may be present on top of top electrode 135 with thickness sufficient to insulate all layers of the resonator stack from the environment, including protection from moisture, corrosives, contaminants, debris and the like.

Acoustic resonator structure 800A further comprises a temperature compensating feature, indicated as a temperature compensating layer 805A in bottom electrode 115, which stabilizes changes of the sound velocity of bottom electrode 115, piezoelectric layer 125 and top electrode 135 in response to changes in temperature. Temperature compensating layer 805A is effectively buried in bottom electrode 115. It is typically accompanied by an overlying interposer layer within bottom electrode 115 and an underlying outside electrode layer within bottom electrode 115.

The presence of the interposer layer is not necessary, although it facilitates proper growth of piezoelectric layer 125 and otherwise provides protection of temperature compensating layer 805A (e.g., from hydrofluoric acid (HF) used for wet etching or wet release process) during the fabrication process. Also, the presence and thickness of the interposer layer affect temperature compensation effects of temperature compensating layer 805A. In addition, a thick enough interposer layer made of low sheet resistance metal, for example, may electrically short temperature compensating layer 805A, therefore eliminating voltage drop across that layer and possibly increasing electromechanical coupling coefficient Kt². On the other hand, a relatively thick interposer layer may acoustically imbalance the acoustic stack by forming a low acoustic energy density region (interposer layer) separating two high acoustic energy density regions (temperature compensating layer 805A and piezoelectric layer 125) which in turn may cause increased loss to acoustic radiation mechanism and decreased quality factor-Q and parallel resistance Rp. Various illustrative temperature compensating layers and fabrication techniques are described by U.S. patent application Ser. No. 13/766,993 (filed Feb. 14, 2013), to Burak et al., which is hereby incorporated by reference in its entirety.

Of course, the relative thicknesses of the outside electrode layer and the interposer layer and/or temperature compensating layer 805A may be varied, without departing from the scope of the present teachings. For example, the thickness of the interposer layer may be increased, thus "sinking" temperature compensating layer 805A deeper into bottom electrode 115 (and further away from the active piezoelectric layer 125). Generally, the thickness and location of temperature compensating layer 805A, as well as the thicknesses of the outside electrode layer and interposer layer, within bottom electrode 115 should be optimized in order to maximize the coupling coefficient for an allowable linear temperature coefficient. This optimization may be accomplished, for example, by modeling an equivalent circuit of the acoustic stack using a Mason model, as would be apparent to one of ordinary skill in the art. Although there is some degradation in the offsetting effects of the temperature coefficient by sinking temperature compensating layer 805A, the coupling coefficient of the acoustic resonator 100B may be improved.

An algorithm may be developed to optimize the depth of temperature compensating layer 805A in bottom electrode 115 in light of the trade-off between the temperature coefficient and the coupling coefficient, for example, using a multivariate optimization technique, such as a Simplex method, as would be apparent to one of ordinary skill in the art. In addition, the depth of temperature compensating layer 805A may be limited by various constraints, such as minimum necessary coupling coefficient and maximum allowable temperature coefficient. Likewise, the thickness of the temperature compensating layer 805A may be adjusted to provide the optimal coupling coefficient and a minimum overall temperature coefficient of the acoustic resonator structure 800A. Such optimization and corresponding considerations regarding temperature compensating layers are also applicable to the other FBARs discussed herein (e.g., acoustic resonators of FIGS. 8B through 10B, discussed below).

As shown in FIG. 8A, the encapsulated temperature compensating layer 805A is surrounded by the outside electrode layer and interposer layer. An example of encapsulating temperature compensating layer 805A is described in more detail by U.S. patent application Ser. No. 13/766, 993 (filed Feb. 14, 2013), to Burak et al., which is hereby incorporated by reference in its entirety. However, in alternative embodiments, temperature compensating layer 805A may not be encapsulated, or may be partially encapsulated, such that at least a portion of temperature compensating layer 805A is exposed at one or more edges (top, bottom or side) of bottom electrode 115. For example, temperature compensating layer 805A may extend the entire width (horizontal direction in the depicted orientation) of bottom electrode 115. Also, for example, a surface of temperature compensating layer 805A may abut a surface of piezoelectric layer 125, that is, when interposer layer is not present.

In bottom electrode 115, the outside electrode layer and interposer layer may be formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In the depicted embodiment, the outside electrode layer and the interposer layer are formed of the same conductive material (e.g., Mo). However, in various alternative embodiments, the outside electrode layer and interposer layer may be formed of different conductive materials, where the outside electrode layer is formed of a material having relatively lower conductivity and relatively higher acoustic impedance, and interposer layer is formed of a material having relatively higher conductivity and relatively lower acoustic impedance. For example, the outside electrode layer may be formed of W and interposer layer may be formed of Mo, although other materials and/or combinations of materials may be used without departing from the scope of the present teachings.

Temperature compensating layer 805A may be formed of various materials compatible with semiconductor processes, including boron silicate glass (BSG), silicon dioxide ($SiO_2$), chromium (Cr) or tellurium oxide (TeO(x)), for example, which have positive temperature coefficients. The positive temperature coefficient of temperature compensating layer 805A offsets negative temperature coefficients of other materials in the acoustic stack, including piezoelectric layer 125, the top electrode 135, and the outside electrode and interposer layers (not shown) of bottom electrode 115.

A double-headed arrow 812 indicates a main membrane region of acoustic resonator structure 800A, and dotted vertical lines indicate a boundary of the main membrane region. This boundary coincides with the edge of top electrode 135, except on connecting side 101, which extends beyond the boundary of the main membrane region. Double-headed arrows 814 and 816 indicate respective collar and frame regions of acoustic resonator structure 800A, and corresponding dotted vertical lines indicate boundaries of these regions. When viewed from a top angle, such as that of FIG. 1A, the above regions and their boundaries may have an apodized shape. As illustrated in FIG. 8A, collar structure 840 has an inner edge that is substantially aligned with the boundary of the main membrane region, and frame 845 has an outer edge that is substantially aligned with the same boundary.

In the example of FIG. 8A, the main membrane region does not include the full extent of overlap between bottom and top electrodes 115 and 135 and piezoelectric layer 125, because the illustrated right side of top electrode 135 is a connecting edge and it is not intended to modify the characteristic electrical impedance at an operating frequency range of acoustic resonator structure 800A in any significant way. However, the overlap between bottom electrode 115, piezoelectric layer 125, top electrode 135 and substrate 105 in the top electrode connecting edge, the above-mentioned "dead FBAR", may cause significant acoustic energy loss since piston mode is electrically excited all the way to the outer perimeter of air cavity 110 in that region, where it may couple to propagating modes supported by substrate 105 region. The presence of collar structure 840 in that region may minimize that unwanted energy loss by mass-loading the top-electrode connecting edge which in turn significantly lowers the amplitude of electrically excited piston mode at an outer edge of air cavity 110.

As mentioned above in relation for FIG. 3, in general a frame is formed by adding a layer of material, usually an electrically conducting material (although dielectric material is possible as well), to the top and/or bottom electrode. The frame can be either a composite frame or an add-on frame, for example. An add-on frame is formed by depositing the material above or below of a layer forming either the bottom or top electrode along a perimeter of the main membrane region. A composite frame is formed by embedding the material within the top or bottom electrode, typically with an exposed upper or lower surface being coplanar with an upper or lower surface of the top or bottom electrode. The use of a composite frame can simplify fabrication of the acoustic resonator with regard to application of layers on planar surfaces. For instance, it can prevent the formation of outcroppings in overlying layers, which can preserve the structural stability of the acoustic resonator. A region of the acoustic resonator above and below the frame will be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cut-off frequency mismatch and an acoustic impedance mismatch between the frame region and other portions of the main membrane region. A frame that lowers the cut-off frequency in the frame region as compared to the main membrane region will be referred to as a Low Velocity Frame (LVF), while a frame that increases the cut-off frequency in the frame region as compared to the main membrane region will be referred to as a High Velocity Frame (HVF). The reasoning behind this nomenclature is that for composite frames (for which thicknesses of the frame and main membrane regions are substantially the same), an increase or decrease of the cut-off frequency is substantially equivalent to an increase or decrease an effective sound velocity of the acoustic stack forming the frame, respectively.

A composite or add-on frame with lower effective sound velocity than the corresponding effective sound velocity of a main membrane (i.e., an LVF) generally increases parallel resistance Rp and Q-factor of the acoustic resonator above the cut-off frequency of the main membrane region. Conversely, a composite or add-on frame with a higher effective sound velocity than the corresponding effective sound velocity of a main membrane (i.e., an HVF) generally decreases series resistance Rs and increases Q-factor of the acoustic resonator below the cut-off frequency of the main membrane region. A typical low velocity frame, for example, effectively provides a region with significantly lower cut-off frequency than the main membrane region and therefore minimizes the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at membrane/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of collars and frames, as well as related materials and operating characteristics, are described in the above cited U.S. patent application Ser. Nos. 13/663,449 and 13/660,941 to Burak et al. As explained in those applications, collars and frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonant frequency, series resistance Rs, parallel resistance Rp, or electromechanical coupling coefficient $Kt^2$. Although the following description presents several embodiments in the form of FBAR devices, several of the described concepts could be implemented in other forms of acoustic resonators, such as SMRs, for example.

As will be apparent from the description of other embodiments, collar structure 840 provides mass loading which lowers the cutoff frequency outside the main membrane region, producing a more laterally uniform cutoff frequency profile across acoustic resonator structure 800A. Similarly, frame 845 suppresses electrically excited piston mode in the frame region, and it reflects and otherwise resonantly (exponentially) suppresses propagating (evanescent and complex) eigenmodes in lateral directions, with both effects simultaneously improving operation of acoustic resonator structure 800A. In other words, performance improvement of acoustic resonator structure 800A is facilitated by at least one of a cut-off frequency mismatch and an acoustic impedance mismatch between the frame region and other portions of the main membrane region which is produced by frame 845.

Figure 8C:
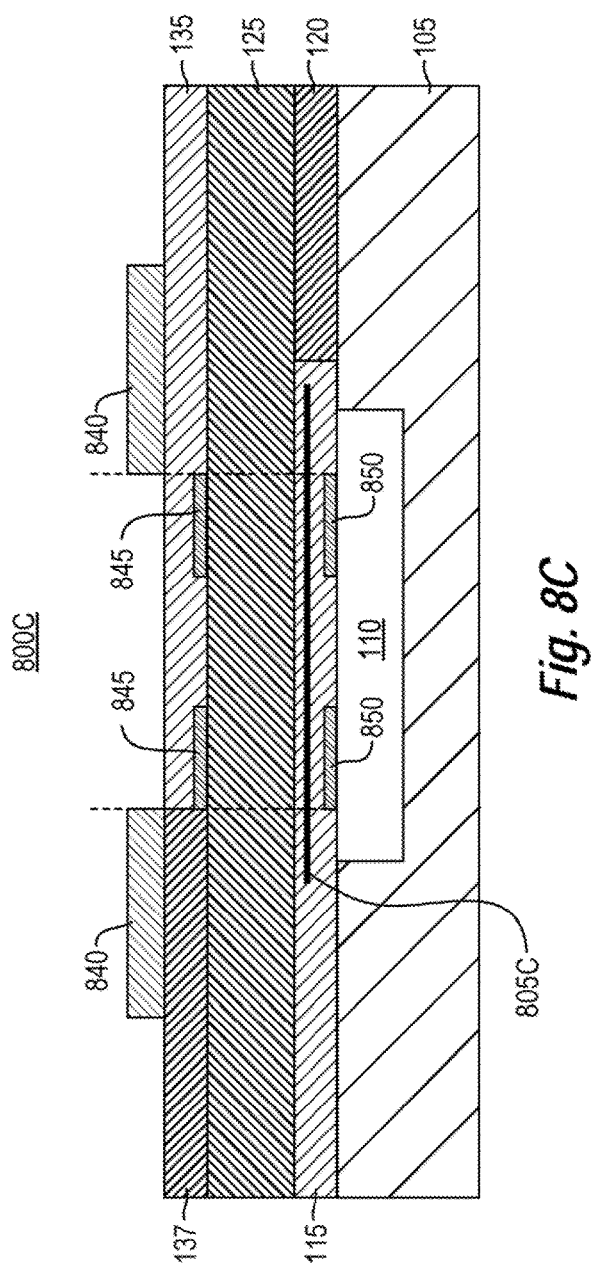
FIG. 8C is a cross-sectional view of an acoustic resonator structure according to a representative embodiment.
Figure 8D:
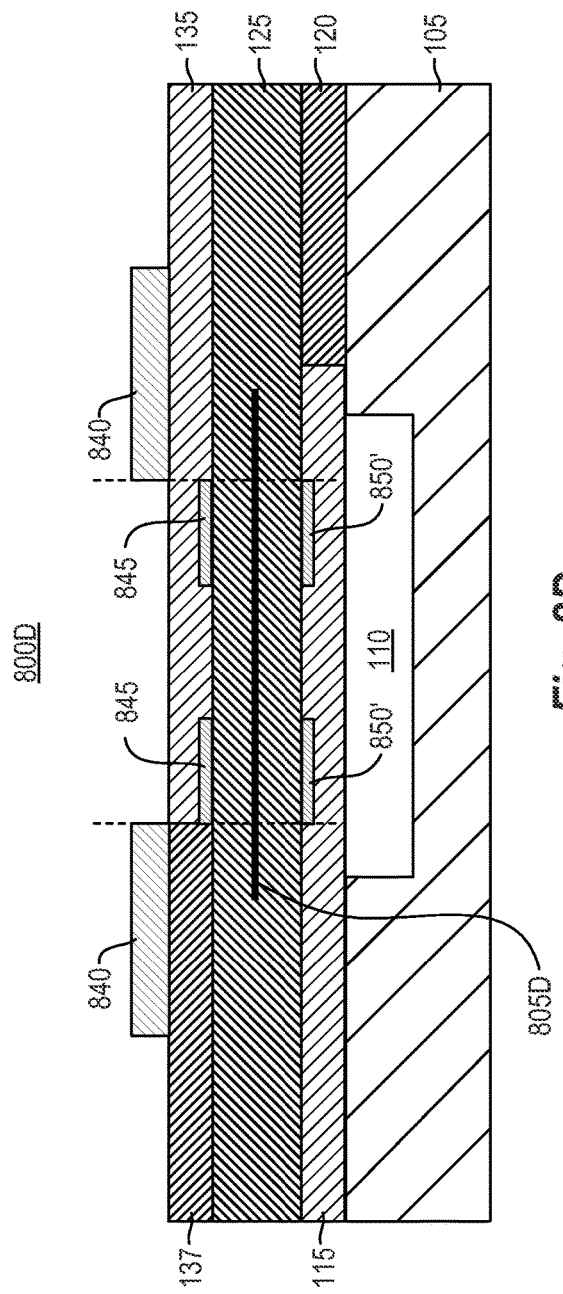
FIG. 8D is a cross-sectional view of an acoustic resonator structure according to a representative embodiment.
Figure 9A:
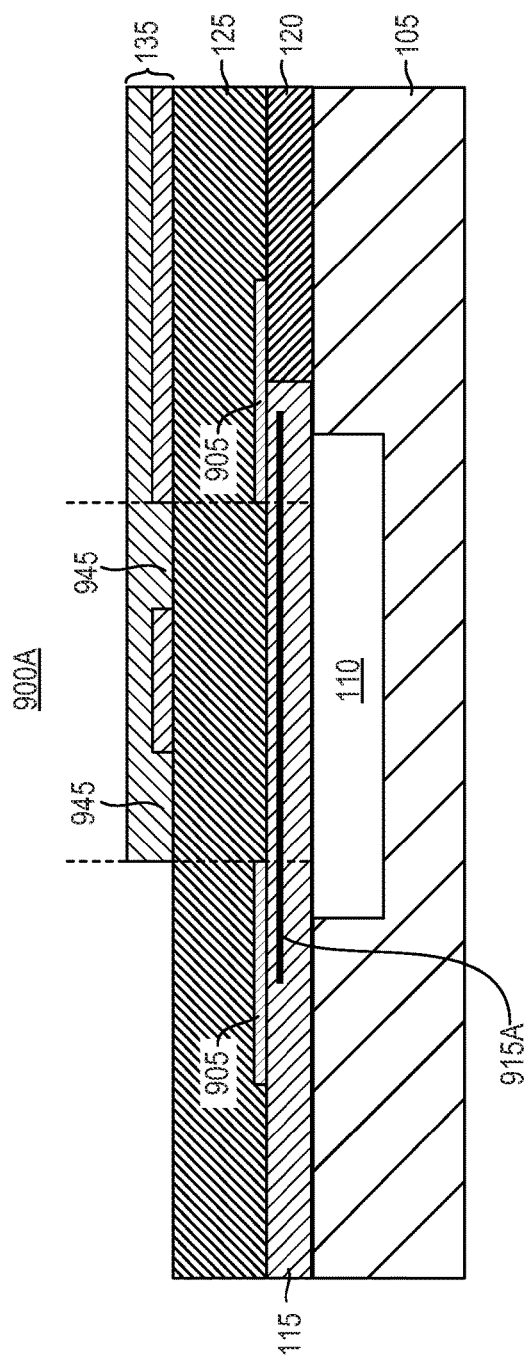
FIG. 9A is a cross-sectional view of an acoustic resonator structure according to a representative embodiment.
Figure 9C:
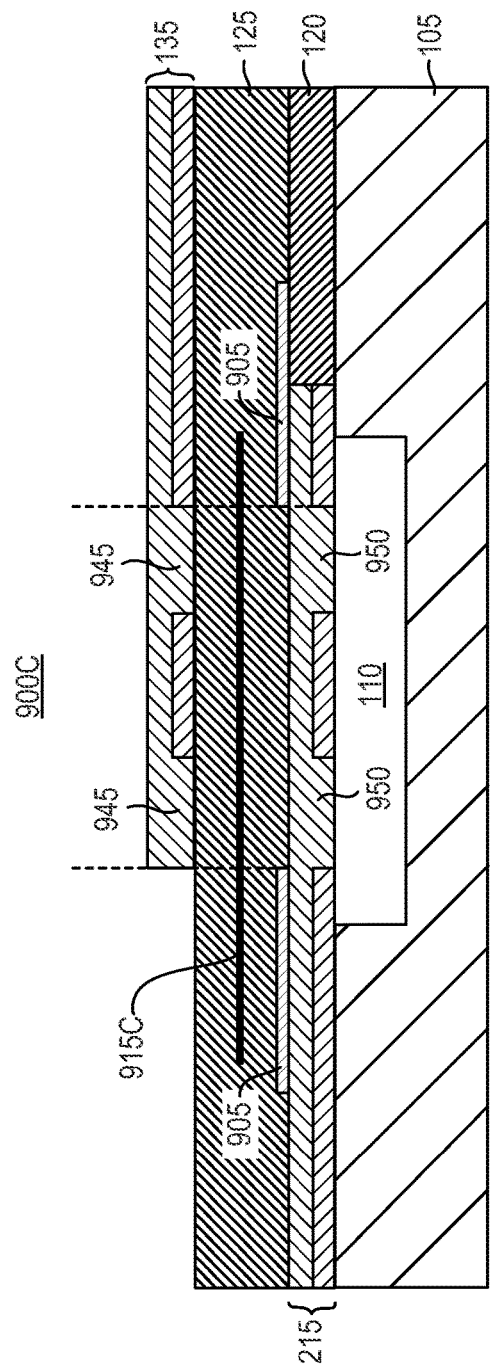
FIG. 9C is a cross-sectional view of an acoustic resonator structure according to a representative embodiment.
Figure 9D:
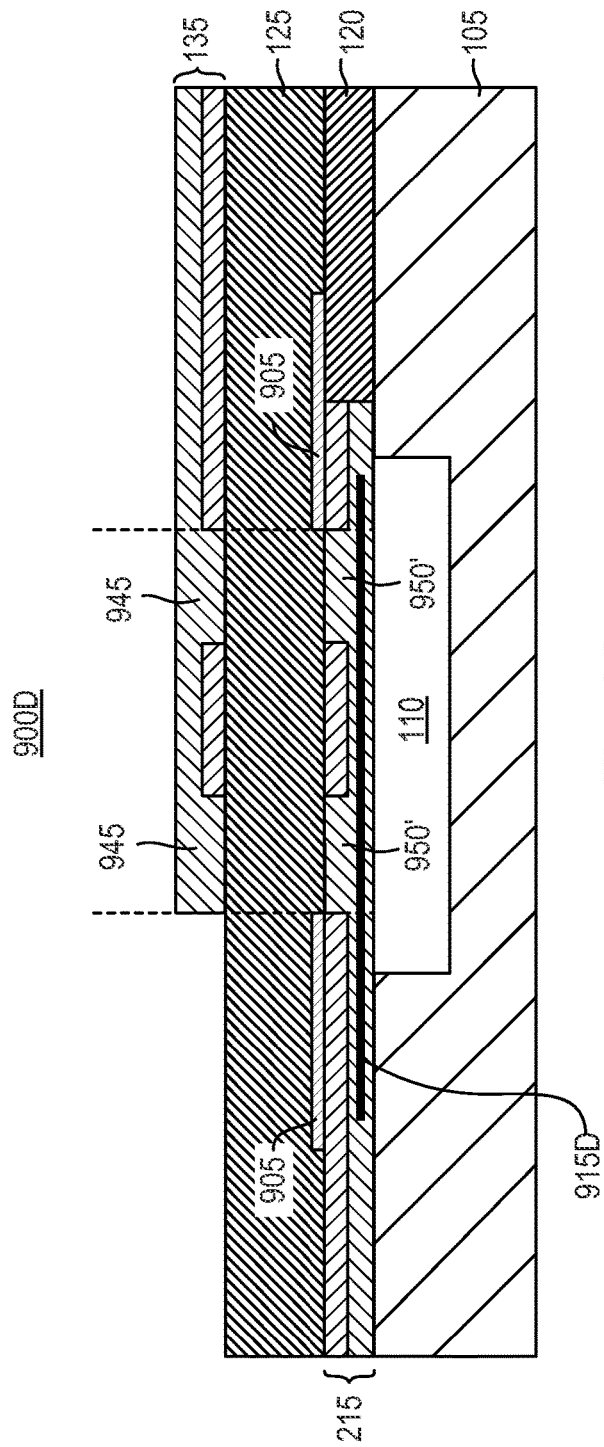
FIG. 9D is a cross-sectional view of an acoustic resonator structure according to a representative embodiment.
Figure 10A:
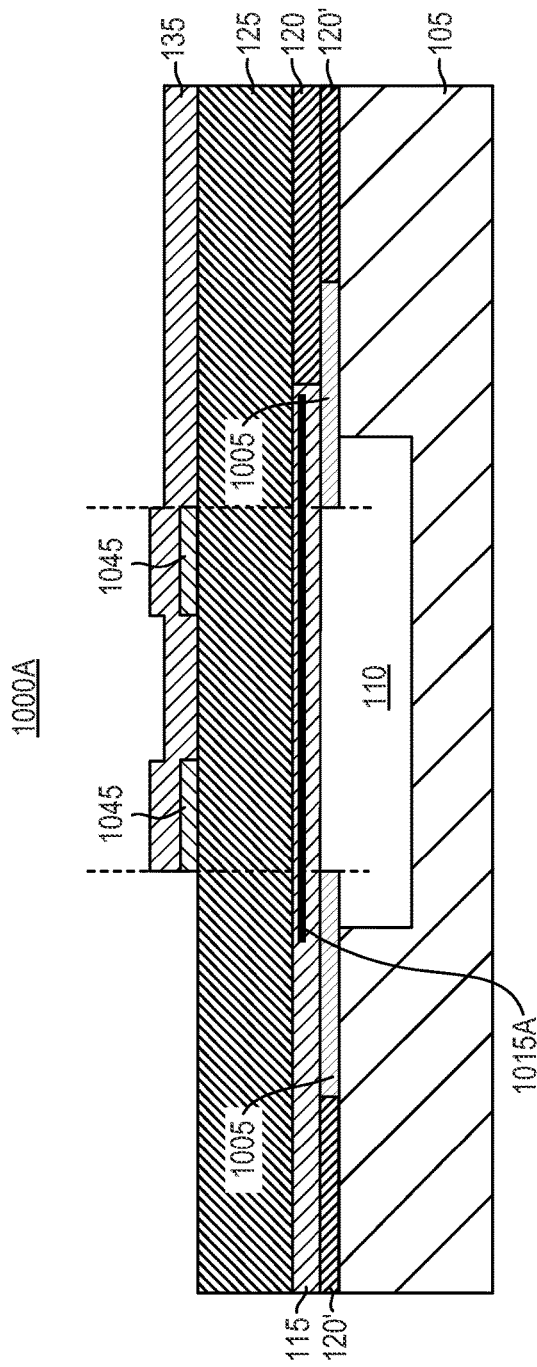
FIG. 10A is a cross-sectional view of an acoustic resonator structure according to a representative embodiment.
Figure 10B:
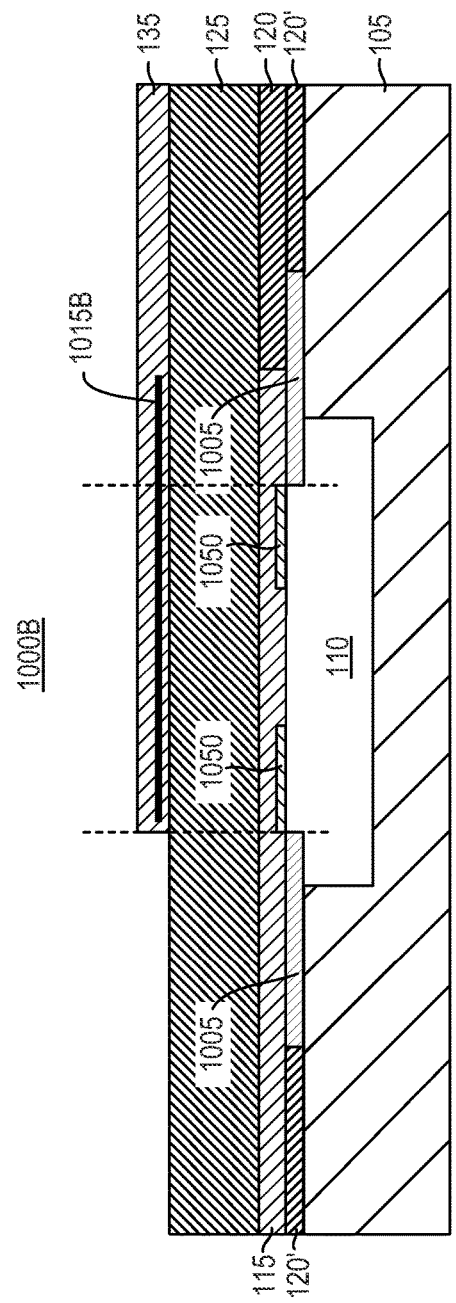
FIG. 10B is a cross-sectional view of an acoustic resonator structure according to a representative embodiment.
Figure 10C:
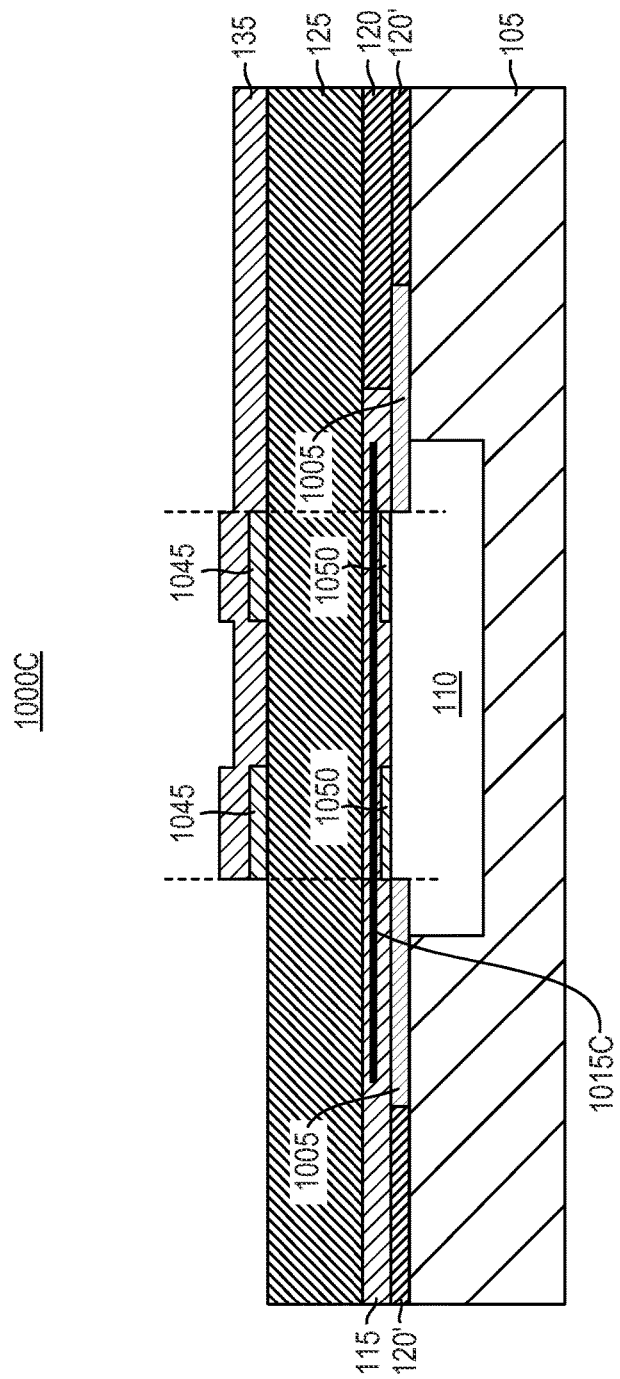
FIG. 10C is a cross-sectional view of an acoustic resonator structure according to a representative embodiment.
Figure 10D:
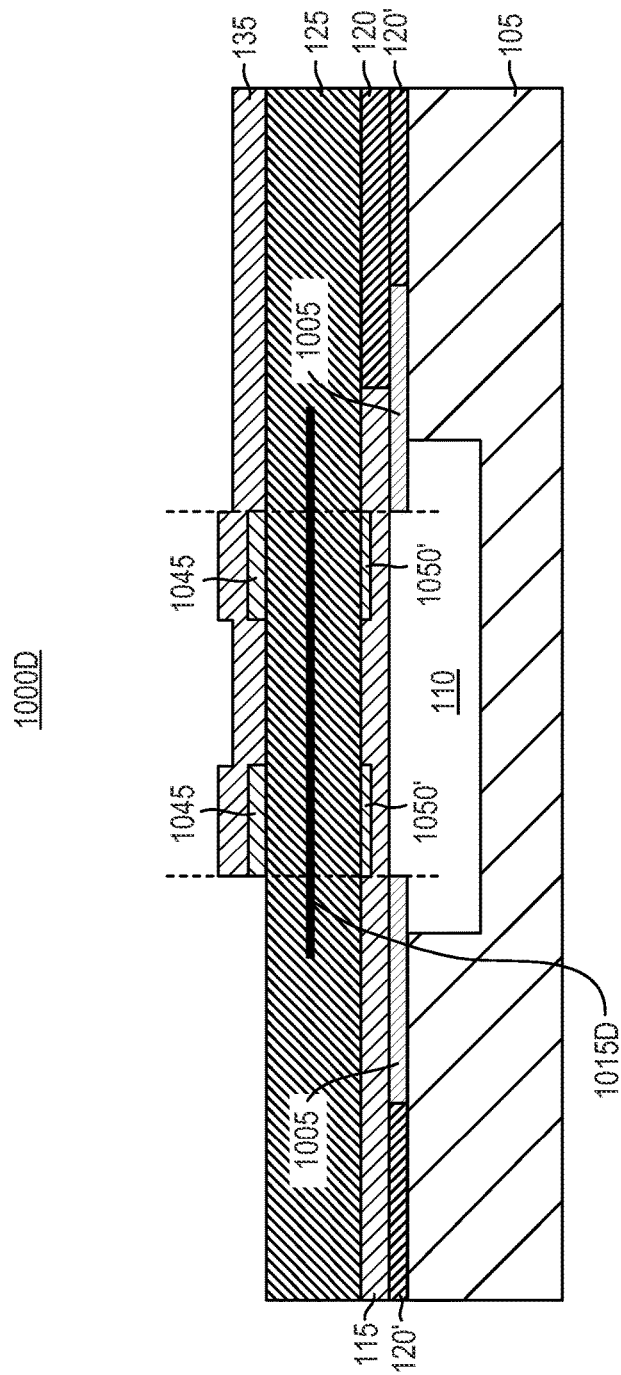
FIG. 10D is a cross-sectional view of an acoustic resonator structure according to a representative embodiment.

Referring to FIGS. 8B, 8C, and 8D, acoustic resonator structure 800B is substantially the same as acoustic resonator structure 800A, except that frame 845 is omitted and replaced by a frame 850 located at a bottom portion of bottom electrode 115, and temperature compensating layer 805A is replaced by a temperature compensating layer 805B located in top electrode 135. Acoustic resonator structure 800C is substantially the same as acoustic resonator structure 800B, except that frames 845 and 850 are both present, and temperature compensating layer 805B is replaced by a temperature compensating layer 805C located in bottom electrode 115. Acoustic resonator structure 800D is substantially the same as acoustic resonator structure 800C, except that frame 850 is replaced by a frame 850', which is located at a top portion of bottom electrode 115 instead of a bottom portion, and temperature compensating layer 805C is replaced by a temperature compensating layer 805D located in piezoelectric layer 125. The frames in acoustic resonator structures 800B through 800D provide benefits similar to frame 845 of acoustic resonator structure 800A, although their performance and manufacturing processes will vary somewhat from acoustic resonator structure 800A due to the different locations of the frames. Some general tradeoffs of different frame configurations are described, for instance, in the above cited U.S. patent application Ser. No. 13/660,941. Similarly, the temperature compensating layers 805B through 805D in FIGS. 8B-8D perform a similar function to temperature compensating layer 805A and may have a similar composition.

FIGS. 9A through 9D are cross-sectional views of acoustic resonators 900A through 900D according to still other representative embodiments. These acoustic resonators are substantially the same as acoustic resonator structures 800A through 800D, respectively, except that collar structure 840 is omitted, a collar structure 905 is instead formed between bottom electrode 115 and piezoelectric layer 125, and temperature compensating layers 915A through 915D are included in the locations shown in the drawings. Collar structure 905 provides benefits similar to collar structure 840 of acoustic resonator structures 800A through 800D, although its performance and manufacture will vary somewhat due to the different location of collar structure 905. Note that for illustrative purposes, the composite frames formed in the bottom electrodes 115 of acoustic resonators 900A through 900D are constructed differently than the frames in the bottom electrodes of acoustic resonator structures 800A through 800D. The top electrode in FIGS. 9A, 9C and 9D comprises of two different metal materials. The bottom electrode in FIGS. 9B, 9C and 9D also comprises of two different metal materials. The frame is formed by embedding the first electrode material into the second electrode material in respective electrodes, as illustrated in FIGS. 9A through 9D. Some general tradeoffs of different frame configurations are described, for instance, in the above cited U.S. patent application Ser. No. 13/663,449.

FIGS. 10A through 10D are cross-sectional views of acoustic resonators 1000A through 1000D according to still other representative embodiments. These acoustic resonators are substantially the same as acoustic resonator structures 800A through 800D, respectively, except that collar structure 840 is omitted, a collar structure 1005 is instead formed between bottom electrode 115 and substrate 105, and temperature compensating layers 1015A through 1015D are included in the locations shown in the drawings. In other words, collar structure 1005 is formed below bottom electrode 115. Like collar structure 905, collar structure 1005 provides benefits similar to collar structure 840 of acoustic resonator structures 800A through 800D, although its performance and manufacture will vary somewhat due to the different location of collar structure 1005. Unlike acoustic resonator structures 800A through 900D where all frames are composite frames, the frames in top electrodes 135 of acoustic resonators 1000A, 1000C and 1000D shown in FIGS. 10A, 10C and 10D, respectively, are the add-on frames. Such frames result in substantially non-planar top electrode 135 profiles in acoustic resonators 1000, 1000C and 1000D. Generally, because usually only a passivation layer would be formed on top electrode 135, such non-planar profile of top electrode 135 would not have any significant impact on structural robustness of acoustic resonators 1000A, 1000C and 1000D. On the other hand, composite frames are formed in bottom electrode 115 of acoustic resonators 1000B, 1000C and 1000D. Such substantially planar frames are preferable in bottom electrode 115 in order to form a high quality, void-free piezoelectric layer 125 and a top electrode layer 135 above bottom electrode 115. Some additional general tradeoffs of different frame configurations are described, for instance, in the above cited U.S. patent application Ser. No. 13/663,449.

Figure 11A:
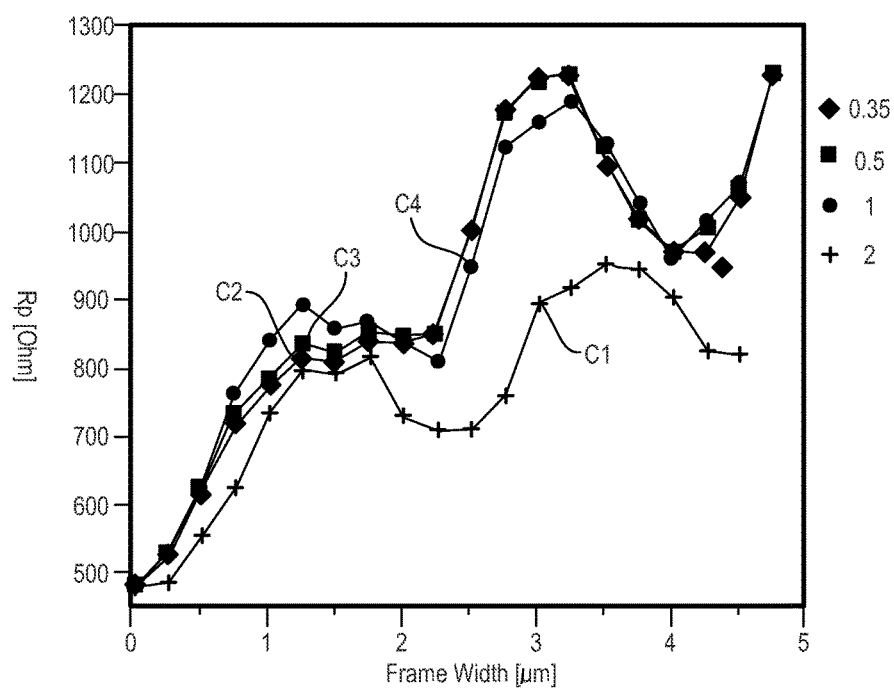
FIG. 11A is a graph illustrating simulated parallel resistance of an acoustic resonator structure under various design configurations.
Figure 11B:
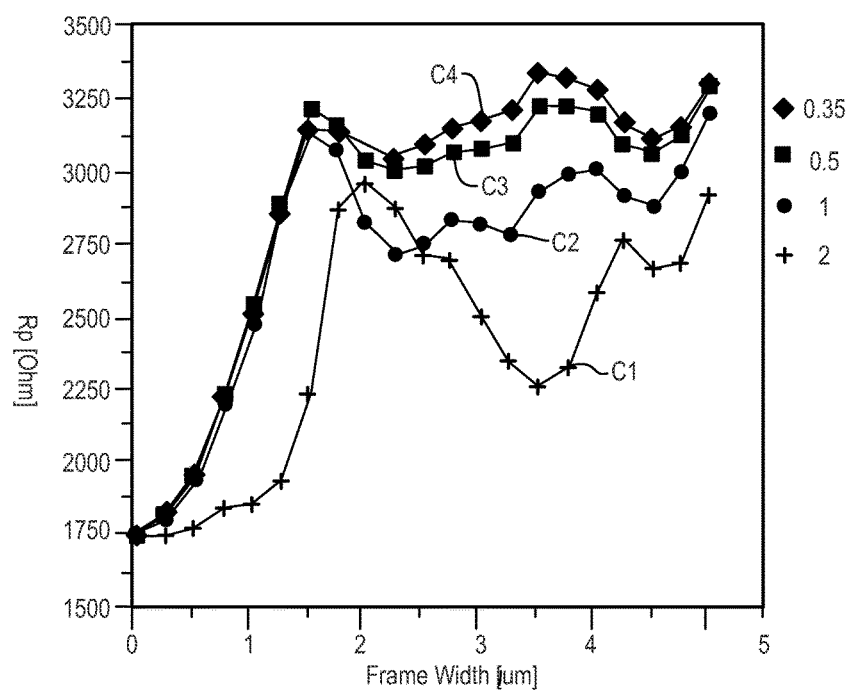
FIG. 11B is another graph illustrating simulated parallel resistance of an acoustic resonator structure under various design configurations.

FIG. 11A is a graph illustrating the simulated parallel resistance Rp of acoustic resonator structure 800A, without collar structure 840 and planarization layer 137, as a function of the width of frame 845, and FIG. 11B is a graph illustrating the parallel resistance of the same acoustic resonator, with collar structure 840 and planarization layer 137, as a function of the width of frame 845. In each of FIGS. 11A and 11B, the functions are plotted for four different thicknesses of frame 845.

In the examples of FIGS. 11A and 11B, frame 845 is formed as a composite of Al/Mo, with different Al thicknesses of 350 Å, 500 Å, 1000 Å, and 2000 Å. Collar structure 840 is formed of sputtered SiC with a width of approximately 11.5 um and a thickness of approximately 4500 Å. Bottom electrode 115 is formed of Mo with a thickness of approximately 3800 Å, piezoelectric layer 125 is formed of AlN with a thickness of approximately 9300 Å, top electrode 135 is formed of Mo with a thickness of approximately 3250 Å, and a passivation layer is formed of AlN with a thickness of approximately 2000 Å.

As illustrated by curves C1 through C4 in each of FIGS. 11A and 11B, the addition of frame 845 (frame width >0) tends to improve the parallel resistance Rp of acoustic resonator structure 800A, both with and without collar structure 840. The magnitude of the improvement varies as a periodic function of the width of frame 845, and it tends to increase generally as the width of frame 845 increases. Additionally, for most widths of frame 845, the parallel resistance Rp tends to be higher for the thinner versions of frame 845, as illustrated by curves C3 and C4 in each of FIGS. 11A and 11B, for example.

The addition of collar structure 840, without any frame, increases parallel resistance Rp by a factor of approximately four, from approximately 500 ohms (FIG. 11A, frame width=0) to nearly 2000 ohms (FIG. 11B, frame width=0). Having both collar structure 840 and frame 845 has an additive effect on Rp, yielding a total increase of approximately 6 times, from approximately 500 ohms (FIG. 11A, frame width=0) to approximately 3200 ohms for the best simulated collar/frame design (FIG. 11B, curve C4, frame width=3.5 um). This additive improvement can be attributed generally to minimization of piston mode scattering loss at interfaces between the frame region and the inner portion of the main membrane region and between the frame region and the collar region, and also to improved suppression of propagating modes excited as a result of piston mode scattering.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:
1. An acoustic resonator structure comprising:
a first electrode disposed on a substrate;
a piezoelectric layer disposed on the first electrode;
a second electrode disposed on the piezoelectric layer;
a frame disposed within a main membrane region defined by an overlap between the first electrode, the piezoelectric layer, and the second electrode, and having an outer edge substantially aligned with a boundary of the main membrane region;
a collar formed separate from the frame, disposed outside the main membrane region, and having an inner edge substantially aligned with the boundary of or overlapping the main membrane region;
a temperature compensation feature having a positive temperature coefficient for offsetting at least a portion of a negative temperature coefficient of the piezoelectric layer, the first electrode, and the second electrode; and a planarization layer disposed on the piezoelectric layer adjacent to the second electrode, wherein the collar is disposed on the planarization layer and the second electrode.

2. The acoustic resonator structure of claim 1, wherein the frame is disposed at a bottom portion of the second electrode.

3. The acoustic resonator structure of claim 1, wherein the piezoelectric layer is doped with at least one rare earth element for offsetting at least a portion of degradation of an electromechanical coupling coefficient of the acoustic resonator structure caused by the temperature compensation feature having the positive temperature coefficient.

4. The acoustic resonator structure of claim 1, wherein the temperature compensation feature comprises a temperature compensation layer embedded in the first electrode.

5. The acoustic resonator structure of claim 1, wherein the temperature compensation feature comprises a temperature compensation layer embedded in the second electrode.

6. The acoustic resonator structure of claim 1, wherein the temperature compensation feature comprises a temperature compensation layer embedded in the piezoelectric layer.

7. An acoustic resonator structure comprising:
a first electrode disposed on a substrate;
a piezoelectric layer disposed on the first electrode;
a second electrode disposed on the piezoelectric layer;
a frame disposed within a main membrane region defined by an overlap between the first electrode, the piezoelectric layer, and the second electrode, and having an outer edge substantially aligned with a boundary of the main membrane region;
a collar formed separate from the frame, disposed outside the main membrane region, and having an inner edge substantially aligned with the boundary of or overlapping the main membrane region; and
a temperature compensation feature having a positive temperature coefficient for offsetting at least a portion of a negative temperature coefficient of the piezoelectric layer, the first electrode, and the second electrode, wherein
the frame is disposed at a bottom portion of the second electrode.

8. The acoustic resonator structure of claim 7, further comprising a planarization layer disposed on the piezoelectric layer adjacent to the second electrode, wherein the collar is disposed on the planarization layer and the second electrode.

9. The acoustic resonator structure of claim 7, wherein the collar is disposed between the first electrode and the piezoelectric layer.

10. The acoustic resonator structure of claim 7, wherein the collar is disposed between the first electrode and the substrate.

11. The acoustic resonator structure of claim 7, wherein the piezoelectric layer is doped with at least one rare earth element for offsetting at least a portion of degradation of an electromechanical coupling coefficient of the acoustic resonator structure caused by the temperature compensation feature having the positive temperature coefficient.

12. The acoustic resonator structure of claim 7, wherein the temperature compensation feature comprises a temperature compensation layer embedded in the first electrode.

13. The acoustic resonator structure of claim 7, wherein the temperature compensation feature comprises a temperature compensation layer embedded in the piezoelectric layer.

14. An acoustic resonator structure comprising:
a first electrode disposed on a substrate;
a piezoelectric layer disposed on the first electrode;
a second electrode disposed on the piezoelectric layer;
a frame disposed within a main membrane region defined by an overlap between the first electrode, the piezoelectric layer, and the second electrode, and having an outer edge substantially aligned with a boundary of the main membrane region;
a collar formed separate from the frame, disposed outside the main membrane region, and having an inner edge substantially aligned with the boundary of or overlapping the main membrane region; and
a temperature compensation feature having a positive temperature coefficient for offsetting at least a portion of a negative temperature coefficient of the piezoelectric layer, the first electrode, and the second electrode, wherein
the frame is disposed at a bottom portion of the first electrode.

15. The acoustic resonator structure of claim 14, wherein the temperature compensation feature comprises a temperature compensation layer embedded in the second electrode.

16. The acoustic resonator structure of claim 14, further comprising a planarization layer disposed on the piezoelectric layer adjacent to the second electrode, wherein the collar is disposed on the planarization layer and the second electrode.

17. The acoustic resonator structure of claim 14, wherein the collar is disposed between the first electrode and the piezoelectric layer.

18. The acoustic resonator structure of claim 14, wherein the collar is disposed between the first electrode and the substrate.

19. The acoustic resonator structure of claim 14, wherein the piezoelectric layer is doped with at least one rare earth element for offsetting at least a portion of degradation of an electromechanical coupling coefficient of the acoustic resonator structure caused by the temperature compensation feature having the positive temperature coefficient.

* * * * *